US012813061B2

(12) United States Patent
Chen et al.

(10) Patent No.: US 12,813,061 B2
(45) Date of Patent: Nov. 24, 2026

(54) QUANTUM DOT LIGAND, QUANTUM DOT-LIGAND MATERIAL, AND QUANTUM DOT LIGHT-EMITTING DEVICE

(71) Applicants: Beijing BOE Technology Development Co., Ltd., Beijing (CN); BOE Technology Group Co., Ltd., Beijing (CN)

(72) Inventors: Zhuo Chen, Beijing (CN); Bing Fang, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 374 days.

(21) Appl. No.: 18/579,873

(22) PCT Filed: Jun. 23, 2022

(86) PCT No.: PCT/CN2022/100894
§ 371 (c)(1),
(2) Date: Jan. 17, 2024

(87) PCT Pub. No.: WO2023/245571
PCT Pub. Date: Dec. 28, 2023

(65) Prior Publication Data
US 2024/0276749 A1 Aug. 15, 2024

(51) Int. Cl.
*H10K 50/115* (2023.01)
*B82Y 20/00* (2011.01)
(Continued)

(52) U.S. Cl.
CPC ............ *H10K 50/115* (2023.02); *B82Y 20/00* (2013.01); *C09K 11/06* (2013.01); *C09K 11/883* (2013.01)

(58) Field of Classification Search
CPC ....... B82Y 20/00; C09K 11/06; C09K 11/883; H10K 50/115
See application file for complete search history.

(56) References Cited

U.S. PATENT DOCUMENTS

| | | | |
|---|---|---|---|
| 10,608,196 | B2 | 3/2020 | Chen et al. |
| 2019/0207136 | A1 | 7/2019 | Chen et al. |

(Continued)

FOREIGN PATENT DOCUMENTS

| | | | |
|---|---|---|---|
| CN | 105733557 | A | 7/2016 |
| CN | 108440756 | A | 8/2018 |

(Continued)

OTHER PUBLICATIONS

International Search Report and Written Opinion mailed on Feb. 24, 2023, in corresponding PCT/CN2022/100894, 7 pages.

*Primary Examiner* — Daniel P Shook
(74) *Attorney, Agent, or Firm* — XSENSUS LLP

(57) ABSTRACT

Provided in the present disclosure are a quantum dot ligand, a quantum dot-ligand material and a quantum dot light-emitting device, which belong to the technical field of displays. The general formula of a structure of the quantum dot ligand is as shown in formula 1, X—Y—Z, where X is a coordinating group configured to form a coordination bond with a quantum dot body; Y is a linking group, which is selected from flexible chains that do not include rigid groups; and Z includes at least two cross-linkable groups, wherein the cross-linkable groups have linking ends, the linking ends of the at least two cross-linkable groups are linked to the same carbon atom, and tail ends of the cross-linkable groups include carbon-carbon double bonds.

19 Claims, 2 Drawing Sheets

(51) Int. Cl.
*C09K 11/06* (2006.01)
*C09K 11/88* (2006.01)

(56) References Cited

U.S. PATENT DOCUMENTS

| | | | | |
|---|---|---|---|---|
| 2020/0266382 | A1* | 8/2020 | Seo | H10K 59/8721 |
| 2023/0140861 | A1* | 5/2023 | Chen | H10K 71/00<br>252/301.36 |

FOREIGN PATENT DOCUMENTS

| | | | |
|---|---|---|---|
| CN | 105070849 | B | 9/2018 |
| CN | 113292463 | A | 8/2021 |
| WO | 2021/164768 | A1 | 8/2021 |

* cited by examiner

QUANTUM DOT LIGAND, QUANTUM DOT-LIGAND MATERIAL, AND QUANTUM DOT LIGHT-EMITTING DEVICE

CROSS REFERENCE TO RELATED APPLICATION

The present disclosure is the U.S. national phase application of International Application No. PCT/CN2022/100894 filed on Jun. 23, 2022, the content of which is incorporated herein by reference in its entirety for all purposes.

TECHNICAL FIELD

The present disclosure relates to the field of display technology, in particular to a quantum dot ligand, a quantum dot-ligand material, and a quantum dot light-emitting device.

BACKGROUND

With the development of quantum dot preparation technology, the stability and luminous efficiency of the quantum dot continue to be improved. The research on QLED (Quantum Dot Light-Emitting Diode) continues to deepen, and the application prospects of QLED in the display field are becoming increasingly bright. However, the efficiency of QLED has not yet reached the mass production level. One important reason is that QLED high-resolution patterning technology has not yet achieved breakthroughs.

The information disclosed in the above section is only intended to enhance the understanding of the background of the present disclosure, and thus can include information that does not constitute the prior art already known to those skilled in the art.

SUMMARY

According to a first aspect of the present disclosure, a quantum dot ligand is provided, and a general formula of a structure of the quantum dot ligand is shown in formula 1, X—Y—Z formula 1; where X is a coordinating group configured to form a coordination bond with a quantum dot body; Y is a linking group, wherein the linking group is selected from a flexible chain that does not comprise a rigid group; and Z comprises at least two cross-linkable groups, wherein the cross-linkable groups have linking ends, the linking ends of the at least two cross-linkable groups are linked to the same carbon atom, and tail ends of the cross-linkable groups comprise carbon-carbon double bonds.

According to a second aspect of the present disclosure, a quantum dot-ligand material is provided, which includes a quantum dot body and the quantum dot ligand as described in the first aspect, wherein a coordination bond is formed between the quantum dot ligand and the quantum dot body.

According to a third aspect of the present disclosure, a method for preparing a quantum dot pattern is provided, including: providing a mixed solution of a photoinitiator and the quantum dot-ligand material as described in the second aspect; coating the mixed solution on a substrate and performing an exposure treatment, so that the carbon-carbon double bonds in the cross-linkable groups are cross linked; and performing development processing to form the quantum dot pattern.

According to a fourth aspect of the present disclosure, a quantum dot light-emitting layer is provided, wherein a material of the quantum dot light-emitting layer comprises a first quantum dot body, a second quantum dot body, and the quantum dot ligand as described in the first aspect; the quantum dot ligand forms coordination bonds with the first quantum dot body and the second quantum dot body, respectively; and the first quantum dot body and the second quantum dot body are cross linked through the cross-linkable groups in the quantum dot ligand to form a network structure.

According to a fifth aspect of the present disclosure, a quantum dot light-emitting device is provided, including the quantum dot light-emitting layer as described in the fourth aspect.

According to a sixth aspect of the present disclosure, a method for preparing a quantum dot light-emitting device is provided, including: providing a first color mixed solution, wherein the first color mixed solution comprises a photoinitiator and a first color quantum dot-ligand material, the first color quantum dot-ligand material comprises a first color quantum dot body and the quantum dot ligand as described in the first aspect, and a coordination bond is formed between the first color quantum dot ligand and the quantum dot body; providing a second color mixed solution, wherein the second color mixed solution comprises a photoinitiator and a second color quantum dot-ligand material, the second color quantum dot-ligand material comprises a second color quantum dot body and the quantum dot ligand as described in the first aspect, and a coordination bond is formed between the second color quantum dot ligand and the quantum dot body; coating a substrate with the first color mixed solution, for exposure and development, to form a first color sub-pixel; and coating the substrate with the second color mixed solution, for exposure and development, to form a second color sub-pixel.

According to a seventh aspect of the present disclosure, a display apparatus is provided, which includes the quantum dot light-emitting device as described in the fifth aspect.

BRIEF DESCRIPTION OF THE DRAWINGS

The above and other features and advantages of the present disclosure will become more apparent through detailed description of embodiments thereof with reference to the drawings.

DETAILED DESCRIPTION

Figure 1:
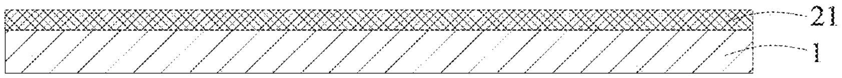
FIG. 1 is a schematic structural diagram of first color quantum dot ligand solution being coated on a substrate according to embodiments of the present disclosure.

Example embodiments will now be described more comprehensively with reference to the drawings. However, the example embodiments can be implemented in various ways and should not be construed as limited to the embodiments set forth herein. Instead, these embodiments are provided so that the present disclosure will be thorough and complete, and will fully convey the concept of example embodiments to those skilled in the art. The described features, structures, or characteristics can be combined in any suitable manner in one or more embodiments. In the following descriptions, many specific details are provided in order to give a thorough understanding of embodiments of the present disclosure.

In the drawings, a thickness of a region or a layer can be exaggerated for clarity. The same reference numerals in the drawings denote the same or similar structures, and thus their detailed descriptions will be omitted.

The described features, structures, or characteristics can be combined in any suitable manner in one or more embodiments. In the following descriptions, many specific details are provided in order to give a thorough understanding of embodiments of the present disclosure. However, those skilled in the art will appreciate that technical solutions of the present disclosure can be practiced without one or more of these specific details, or other methods, components, materials, etc., can be employed. In other instances, well-known structures, materials, or operations are not shown or described in detail to avoid obscuring the main technical concept of the present disclosure.

When a structure is "on" one other structure, it can mean that the structure is integrally formed on the other structure, or that the structure is "directly" arranged on the other structure, or that the structure is "indirectly" arranged on the other structure through another structure.

Terms "a", "an", "the" are used to indicate presence of one or more elements/components/etc. Terms "include" and "have" are used to indicate an open-ended inclusion and refer to presence of additional elements/components/etc., in addition to the listed elements/components/etc. Terms "first" and "second", etc., are used only as labels and are not intended to limit the number of objects.

Quantum dots (QD) are nanomaterials with crystal diameters between 2-10 nm, composed of zinc, cadmium, selenium, and sulfur atoms. The quantum dots have unique optoelectronic properties, and when stimulated by the photoelectric light, they emit pure monochromatic light of different colors based on diameters of the quantum dots, which can change the color of the light source.

In the related art, in the production process of the QLED display panel, designers use quantum dot materials with photosensitive properties to achieve patterned preparation of quantum dot films directly on the substrate through photolithography and development processes (i.e. direct photolithography), thereby achieving high pixel density (high resolution) of self-luminous QLED display products. However, in the related art, the stability of the quantum dot film layer left behind in the exposed area is weak. When using a strong development process, the unexposed quantum dot film layer is completely developed, while the quantum dot film layer left behind in the exposed area is also easily damaged by the strong development process, and even completely peeled off from the surface of the substrate. Therefore, it is not possible to achieve direct photolithography for the preparation of patterned quantum dot film layer.

In embodiments of the present disclosure, a quantum dot ligand is provided, and a general formula of a structure of the quantum dot ligand is shown in formula 1, $$X—Y—Z, \quad \text{formula 1}$$

where X is a coordinating group configured to form a coordination bond with the quantum dot body;

Y is a linking group, which is selected from a flexible chain capable of internal rotation; and Z includes at least two cross-linkable groups, wherein the cross-linkable groups have linking ends, the linking ends of the at least two cross-linkable groups are linked to the same carbon atom, and tail ends of the cross-linkable groups contain carbon-carbon double bonds.

The quantum dot ligand provided in the present disclosure contains a coordinating group and at least two cross-linkable groups. The coordinating group is configured to form a coordination bond with the quantum dot body. The tail ends of the cross-linkable groups contain carbon-carbon double bonds. The carbon-carbon double bonds can undergo the crosslinking reaction with the assistance of photoinitiators. Due to the fact that the quantum dot ligand provided in the present disclosure contains at least two cross-linkable groups, and a linking segment of the at least two cross-linkable groups are linked to the same carbon atom, the quantum dot ligand can undergo more cross-linking reactions, form higher cross-linking strength, improve the stability of cross-linked products in the exposure area, enhance the binding ability of the quantum dot light-emitting layer to the substrate, and form the stable quantum dot light-emitting layer.

The quantum dots (QD) are inorganic semiconductor nanoparticles synthesized through solution method with sizes between 1-10 nm, which are approximately or smaller than the Exciton Bohr radius of the particles. The quantum dots, due to their small size and large specific surface area, are prone to agglomeration, and the quantum dots have many surface defects. Therefore, when applied, the surface of the quantum dot is usually coated with an organic surface ligand, which not only provides protection but also improves the solubility of the quantum dot in the solution. The migration of charge carriers (electrons and holes) in the quantum dot is restricted within the interior of the quantum dot, giving the quantum dot unique optical and electrical properties. Due to its unique size dependent property, the absorbance and luminescence properties of the quantum dot can be easily adjusted by controlling the size, the shape, or the surface structure of particles.

The quantum dot body according to the present disclosure can be a semiconductor nanocrystal and can have various shapes such as spherical, conical, multi armed, and/or cubic nanoparticles, nanotubes, nanowires, nanofibers, nanoplate particles, quantum rods, or quantum pieces. The quantum rod can be a quantum dot body with an aspect ratio (a length-diameter ratio) (length to width ratio) greater than or equal to about 1, for example, greater than or equal to about 2, greater than or equal to about 3, or greater than or equal to about 5. For example, the quantum rod can have an aspect ratio of less than or equal to about 50, less than or equal to about 30, or less than or equal to about 20.

The quantum dot body can have a particle diameter (for a non-spherical shape, an average maximum particle length) of for example, about 1 nm to about 100 nm, about 1 nm to about 80 nm, about 1 nm to about 50 nm, or about 1 nm to about 20 nm.

The energy band gap of the quantum dot body can be controlled based on the size and the composition of the quantum dot body, and thus an emission wavelength of the light can be controlled. For example, when the size of the quantum dot body increases, the quantum dot body can have a narrow band gap and thus be configured to emit light in a relatively long wavelength region, while when the size of the quantum dot body decreases, the quantum dot body can have a wide band gap and thus be configured to emit light in a relatively short wavelength region. For example, the quantum dot body can be configured to emit light in a predetermined wavelength region of the visible light region based on its size and/or composition. For example, the quantum dot body can be configured to emit a second color light, a third color light, or a first color light. The second color light can have a peak emission wavelength (λ is maximum), for example, in the range of about 430 nm to about 480 nm. The third color light can have a peak emission wavelength (λ is maximum), for example, in the range of about 600 nm to about 650 nm. The first color light can have a peak emission wavelength (λ is maximum), for example, in the range of about 520 nm to about 560 nm. However, the present disclosure is not limited to this.

For example, an average particle size of a quantum dot body configured to emit the second color light can be, for example, less than or equal to about 4.5 nm, and for example, less than or equal to about 4.3 nm, less than or equal to about 4.2 nm, less than or equal to about 4.1 nm, or less than or equal to about 4.0 nm. Within the range, for example, an average particle size of the quantum dot body can be from about 2.0 nm to about 4.5 nm, from about 2.0 nm to about 4.3 nm, from about 2.0 nm to about 4.2 nm, from about 2.0 nm to about 4.1 nm, or from about 2.0 nm to about 4.0 nm.

The quantum dot body can have a quantum yield of, for example, greater than or equal to about 10%, greater than or equal to about 20%, greater than or equal to about 30%, greater than or equal to about 50%, greater than or equal to about 60%, greater than or equal to about 70%, or greater than or equal to about 90%.

The quantum dot body can have a relatively narrow full width at half maxima (FWHM). The FWHM here is the width of the wavelength corresponding to half of the peak absorption point, and when the FWHM is narrow, the quantum dot can be configured to emit light in a narrow wavelength region and achieve high color purity. The quantum dot body can have an FWHM of for example, less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm. Within the above range, the quantum dot body can have an FWHM of, for example, about 2 nm to about 49 nm, about 2 nm to about 48 nm, about 2 nm to about 47 nm, about 2 nm to about 46 nm, about 2 nm to about 45 nm, about 2 nm to about 44 nm, about 2 nm to about 43 nm, about 2 nm to about 42 nm, about 2 nm to about 41 nm, about 2 nm to about 40 nm, about 2 nm to about 39 nm, about 2 nm to about 38 nm, about 2 nm to about 37 nm, about 2 nm to about 36 nm, about 2 nm to about 35 nm, about 2 nm to about 34 nm, about 2 nm to about 33 nm, about 2 nm to about 32 nm, about 2 nm to about 31 nm, about 2 nm to about 30 nm, about 2 nm to about 29 nm, or about 2 nm to about 28 nm.

For example, the quantum dot body can include II-VI semiconductor compounds, III-V semiconductor compounds, IV-VI semiconductor compounds, IV group semiconductor compound, I-II-VI semiconductor compounds, I-II-IV-VI semiconductor compounds, II-III-V semiconductor compounds, or combinations thereof. The II-VI semiconductor compounds can be selected from binary compounds such as CdSe, CdTe, ZnS, ZnSe, ZnTe, ZnO, HgS, HgSe, HgTe, MgSe, MgS, or mixtures thereof; ternary compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or mixtures thereof; and quaternary compounds such as HgZnTeS, CdZnSeS, CdZnSeTe, CdZnSTe, CdHgSeS, CdHgSeTe, CdHgSTe, HgZnSeS, HgZnSeTe, HgZnSTe, or mixtures thereof, but the present disclosure is not limited to this. The III-V semiconductor compounds can be selected from binary compounds such as GaN, GaP, GaAs, GaSb, AlN, AlP, AlAs, AlSb, InN, InP, InAs, InSb, or mixtures thereof; ternary compounds such as GaNP, GaNAs, GaNSb, GaPAs, GaPSb, AlNP, AlNAs, AlNSb, AlPAs, AlPSb, InNP, InNAs, InNSb, InPAs, InPSb, or mixtures thereof; and quaternary compounds such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or mixtures thereof, but the present disclosure is not limited to this. The IV-VI semiconductor compounds can be selected from, for example, binary compounds such as SnS, SnSe, SnTe, PbS, PbSe, PbTe, or mixtures thereof; ternary compounds such as SnSeS, SnSeTe, SnSTe, PbSeS, PbSeTe, PbSTe, SnPbS, SnPbSe, SnPbTe, or mixtures thereof; and quaternary compounds such as SnPbSSe, SnPbSeTe, SnPbSTe, or mixtures thereof, but the present disclosure is not limited to this. The IV group semiconductors can be selected from, for example, elemental (unary) semiconductors such as Si, Ge, or mixtures thereof; and binary semiconductor compounds such as SiC. SiGe, or mixtures thereof, but the present disclosure is not limited to this. The I-III-VI semiconductor compounds can be, for example, CuInSe2, CuInS2, CuInGaSe, CuInGaS, or mixtures thereof, but the present disclosure is not limited to this. The I-II-IV-VI semiconductor compounds can be, for example, CuZnSnSe, CuZnSnS, or mixtures thereof, but the present disclosure is not limited to this. The II-III-V semiconductor compounds can include, for example, InZnP, but the present disclosure is not limited to this.

The quantum dot body can have a basically uniform concentration or locally different concentration distribution, including the elemental semiconductors, the binary semiconductor compounds, the ternary semiconductor compounds, or the quaternary semiconductor compounds.

For example, the quantum dot body can include a cadmium (Cd) free quantum dot body. The cadmium free quantum dot are a quantum dot that does not include cadmium (Cd). The cadmium (Cd) can cause serious environmental/health problems and is a restricted element under the Restriction of Hazardous Substances (RoHS) in multiple countries, and therefore the cadmium free based quantum dot can be effectively used.

In some embodiments, the quantum dot body can be a semiconductor compound including at least one of zinc (Zn), tellurium (Te), and selenium (Se). For example, the quantum dot body can be a Zn—Te semiconductor compound, a Zn—Se semiconductor compound, and/or a Zn—Te—Se semiconductor compound. For example, the amount of tellurium (Te) in the Zn—Te—Se semiconductor compound can be less than the amount of selenium (Se). The semiconductor compound can have a peak emission wavelength (λ is maximum) in a wavelength range of less than or equal to about 480 nm, such as about 430 nm to about 480 nm, and can be configured to emit second color light.

In some embodiments, the quantum dot body can be a semiconductor compound including indium (In), as well as at least one of zinc (Zn) and phosphorus (P). For example, the quantum dot body can be an In—P semiconductor compound and/or an In—Zn—P semiconductor compound. For example, in the In—Zn—P semiconductor compound, the molar ratio of zinc (Zn) to indium (In) can be greater than or equal to about 25. The semiconductor compound can have a peak emission wavelength (λ is maximum) in a wavelength range of less than about 700 nm, such as about 600 nm to about 650 nm, and can be configured to emit third color light.

The quantum dot body can have a core-shell structure. For example, the core and the shell of the quantum dot body can have an interface, and at least one element of the core or the shell in the interface can have a concentration gradient, where the concentration of the shell element decreases towards the core. In some embodiments, the material composition of the shell of the quantum dot body has a higher energy band gap than the material composition of the core of the quantum dot body, and thus the quantum dot body can exhibit a quantum confinement effect.

The quantum dot body can have one quantum dot core and multiple layers of quantum dot shells surrounding the core. In some embodiments, the multiple layers of shells have at least two shells, each of which can be of a single composition, an alloy, and/or have a concentration gradient.

In some embodiments, a shell among the multiple layers of shells away from the core can have a higher energy band gap than a shell close to the core, and thus the quantum dot itself can exhibit the quantum confinement effect.

In some embodiments, a quantum dot body having a core-shell structure can include, for example, a core including a first semiconductor compound, and the first semiconductor compound includes zinc (Zn), as well as at least one of tellurium (Te) and selenium (Se), and a shell including a second semiconductor compound located on at least a portion of the core and having a composition different from a composition of the core.

In some embodiments, the first semiconductor compound can be a Zn—Te—Se based semiconductor compound including zinc (Zn), tellurium (Te), and selenium (Se), for example, a Zn—Se based semiconductor compound including a small amount of tellurium (Te), and for example, a semiconductor compound represented by ZnTexSe1-x, where x is greater than about 0 and less than or equal to 0.05.

In some embodiments, in a Zn—Te—Se based first semiconductor compound, the molar amount of zinc (Zn) can be higher than the molar amount of selenium (Se), and the molar amount of selenium (Se) can be higher than the molar amount of tellurium (Te). For example, in the first semiconductor compound, the molar ratio of tellurium (Te) to selenium (Se) can be less than or equal to about 0.05, less than or equal to about 0.049, less than or equal to about 0.048, less than or equal to about 0.047, less than or equal to about 0.045, less than or equal to about 0.044, less than or equal to about 0.043, less than or equal to about 0.042, less than or equal to about 0.041, less than or equal to about 0.04, less than or equal to about 0.039, less than or equal to about 0.035, less than or equal to about 0.03, less than or equal to about 0.029, less than or equal to about 0.025, less than or equal to about 0.024, less than or equal to about 0.023, less than or equal to about 0.022, less than or equal to about 0.021, less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.01. In some embodiments, in the first semiconductor compound, the molar ratio of tellurium (Te) to zinc (Zn) can be less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.010.

The second semiconductor compound can include, for example, II-VI semiconductor compounds, III-V semiconductor compounds, IV-VI semiconductor compounds, IV group semiconductors, I-III-VI semiconductor compounds, I-II-IV-VI semiconductor compounds, II-III-V semiconductor compounds, or combinations thereof. Examples of II-VI semiconductor compounds, III-V semiconductor compounds, IV-VI semiconductor compounds, IV group semiconductors, I-III-VI semiconductor compounds, I-II-IV-VI semiconductor compounds, and II-III-V semiconductor compounds are the same as described above.

In some embodiments, the second semiconductor compound can include zinc (Zn), selenium (Se), and/or sulfur (S). For example, the shell can include ZnSeS, ZnSe, ZnS, or combinations thereof. For example, the shell can include at least one inner shell located near the core and an outermost shell located at the outermost layer of the quantum dot body. The inner shell can include ZnSeS, ZnSe, or a combination thereof, and the outermost shell can include ZnS. For example, the shell can have a concentration gradient of one component, and the amount of sulfur (S) can increase as it is away from the core.

In some embodiments, a quantum dot body having a core-shell structure can include: a core including a third semiconductor compound, and the third semiconductor compound includes indium (In), as well as at least one of zinc (Zn) and phosphorus (P); and a shell a including fourth semiconductor compound located on at least a portion of the core and having a composition different from a composition of the core.

In an In—Zn—P based third semiconductor compound, the molar ratio of zinc (Zn) to indium (In) can be greater than or equal to about 25. For example, in the In—Zn—P based third semiconductor compound, the molar ratio of zinc (Zn) to indium (In) can be greater than or equal to about 28, greater than or equal to about 29, or greater than or equal to about 30. For example, in the In—Zn—P based third semiconductor compound, the molar ratio of zinc (Zn) to indium (In) can be less than or equal to about 55, such as less than or equal to about 50, less than or equal to about 45, less than or equal to about 40, less than or equal to about 35, less than or equal to about 34, less than or equal to about 33, or less than or equal to about 32.

The fourth semiconductor compound can include, for example, II-VI semiconductor compounds, III-V semiconductor compounds, IV-VI semiconductor compounds, IV group semiconductors, I-III-VI semiconductor compounds, I-II-IV-VI semiconductor compounds, II-III-V semiconductor compounds, or combinations thereof. Examples of II-VI semiconductor compounds, III-V semiconductor compounds, IV-VI semiconductor compounds, IV group semiconductors, I-III-VI semiconductor compounds, I-II-IV-VI semiconductor compounds, and II-III-V semiconductor compounds are the same as described above.

In some embodiments, the fourth semiconductor compound can include zinc (Zn) and sulfur (S), as well as optionally selenium (Se). For example, the shell can include ZnSeS, ZnSe, ZnS, or a combination thereof. For example, the shell can include at least one inner shell located near the core and an outermost shell located at the outermost layer of the quantum dot body. At least one of the inner shell and the outermost shell can include a fourth semiconductor compound ZnS, ZnSe, or ZnSeS.

In the present disclosure, the quantum dot ligand can link the quantum dot ligand to a surface of the quantum dot body by forming the coordination bond between the coordinating group and the surface of the quantum dot body.

Y is the linking group, which is selected from a flexible chain that does not include rigid groups. In the present disclosure, the rigid groups can refer to groups not capable of internal rotation, such as aromatic rings, heteroaromatic rings, etc. A flexible chain refers to a chain segment on the main chain where the chemical bonds have internal rotational degrees of freedom. In some embodiments, the linking group is selected from a flexible chain containing a carbon-carbon single bond capable of internal rotation, meaning that certain structures within the linking group can rotate around the carbon-carbon single bond relative to the molecular skeleton of the linking group, such as alkylene. Compared with the segments containing rigid groups, the flexible chains disclosed in the present disclosure have higher mobility, which helps to enhance the content of quantum dot ligands on the surface of the quantum dot body, improve the encapsulation degree of the quantum dot ligand on the quantum dot body, and meet the requirements of the quantum dot light-emitting layer.

In some embodiments, the linking group is selected from a straight chain alkylidene with 2-8 carbon atoms. The linking groups within this range have good flexibility and low steric hindrance, which facilitate the binding of the quantum dot ligand to the surface of the quantum dot body. Moreover, the linking groups within this range do not affect the injection of charge carriers (electrons and holes) into the quantum dot, thus not affecting the performance of the quantum dot light-emitting device.

In some embodiments, the carbon atom number of alkyl groups can be 2, 3, 4, 5, 6, 7, or 8, such as ethylidene, propylidene, butylene, pentylene, hexidene, heptanyl, octyl, etc.

Z includes at least two cross-linkable groups, which have linking ends that can be configured to link with other groups. The at least two cross-linkable groups are linked to the same carbon atom. The tail end of the cross-linkable group is a carbon-carbon double bond. Under the action of the photoinitiators and the light, the carbon-carbon double bond of the cross-linkable group can generate a free radical. Due to the fact that cross-linkable groups are linked to the same carbon atom, the distance between carbon-carbon double bonds is relatively short. Therefore, among the at least two cross-linkable groups linked to the same carbon atom, the free radical generated by the carbon-carbon double bond of one of the cross-linkable groups can trigger the carbon-carbon double bond of the next cross-linkable group to generate a new free radical. For example, Z includes two cross-linkable groups, and the linking ends of the two cross-linkable groups are linked to the same carbon atom. Under the action of the photoinitiators and the light, the carbon-carbon double bond of one of these two cross-linkable groups generates a free radical, and the free radical generated by this cross-linkable group can trigger the carbon-carbon double bond of the other cross-linkable group to generate a new free radical, which can effectively enable the conduction and regeneration of the free radical, thereby increasing the degree of crosslinking reaction and crosslinking degree.

In some embodiments of the present disclosure, the cross-linkable group further includes an ester structure (—COO—) linked between the linking end and the carbon-carbon double bond.

The cross-linkable groups include an acrylic ester structure or an alkylated acrylic ester structure, and the carbon-carbon double bond in the acrylic ester structure or the alkylated acrylic ester structure of the cross-linkable groups are located at the tail ends of the cross-linkable groups.

In some embodiments of the present disclosure. Z has a structure as described in formula 2, formula 2

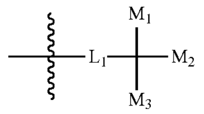

formula 2-1

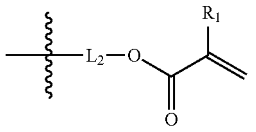

formula 2-2

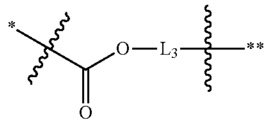

where

represents a chemical bond;

* represents the structure shown in formula 2-2 is configured for linking with Y, and

* * represents the structure shown in formula 2-2 is configured for linking with

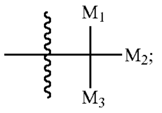

M1, M2, and M3 are independently selected from hydrogen, alkyl groups with 1-10 carbon atoms, conjugated groups, polyethylene glycol segments, or the structure shown in formula 2-1, and at least two of M1, M2, and M3 are selected from the structure shown in formula 2-1;

$L_1$ is selected from the structure shown in formula 2-2;

$R_1$ is selected from hydrogen or alkyl groups with 1-6 carbon atoms; and $L_2$ and $L_3$ are independently selected from alkylene groups with 1-6 carbon atoms.

In the present disclosure, the description used "independently selected from" is broadly understood, which can not only refer to that the specific options expressed by the same symbols in different groups do not affect each other, but also refer to that the specific options expressed by the same symbols in the same group do not affect each other.

In some embodiments, alkyl groups with 1-10 carbon atoms can include alkyl groups with a carbon atom number of 1, 2, 3, 4, 5, 6, 7, 8, 9, or 10, such as methyl, ethyl, propyl, isopropyl, butyl, tert butyl, pentyl, hexyl, etc., but the present disclosure is not limited to this.

The conjugated group contributes to forming a quantum dot-ligand material with strong carrier transport capability between the quantum dot ligand and the quantum dot body. In some embodiments, the conjugated group is selected from aniline structures, triphenylamine structures, or carbazole structures. In some embodiments, the triphenylamine structures and the carbazole structures are conducive to hole transport.

The polyethylene glycol (PEG) segment increases the solubility of the quantum dot ligand in PGMEA (propylene glycol methyl ether acetate), TMAH (tetramethylammonium hydroxide), or other aqueous solutions. The TMAH (tetramethylammonium hydroxide) and the PGMEA (Propylene glycol methyl ether acetate) are commonly used solvents in the photolithography process for the display apparatus. In practical processes, the PGMEA can be used for spin or scrape coating of a solution containing quantum dot bodies and quantum dot ligands into a film, and the TMAH alkaline aqueous solution can be used for development.

In some embodiments, M1, M2, and M3 are independently selected from hydrogen, alkyl groups with 1-10 carbon atoms, conjugated groups, polyethylene glycol segments, or a collection composed of the following groups:

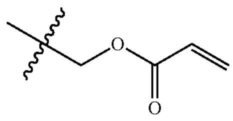

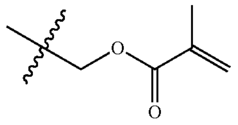

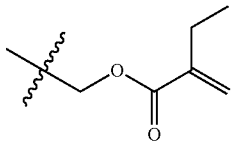

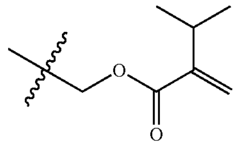

-continued

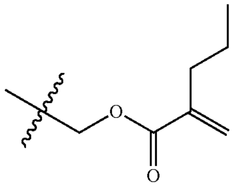

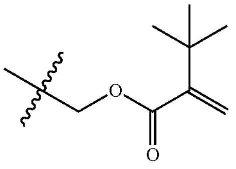

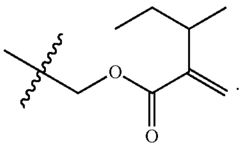

In some embodiments, $L_1$ is selected from the following groups:

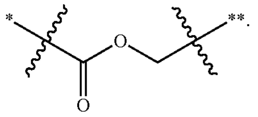

In some embodiments, Z is selected from a collection composed of the following groups:

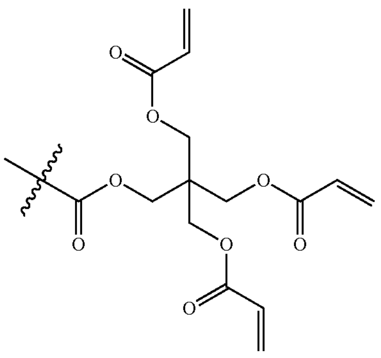

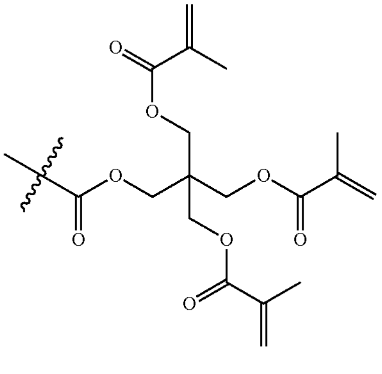

-continued

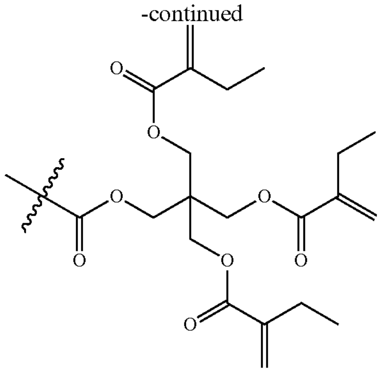

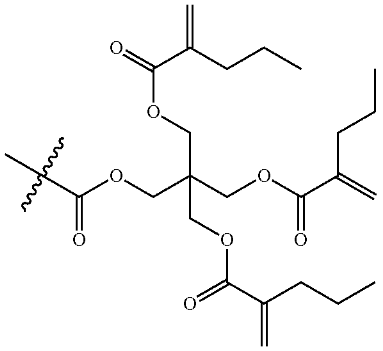

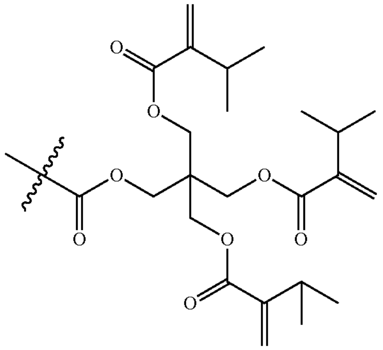

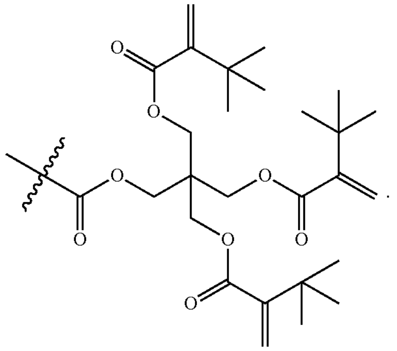 [SMILES: *C(=O)OCC(COC(=O)C(=C)C(C)(C)C)(COC(=O)C(=C)C(C)(C)C)COC(=O)C(=C)C(C)(C)C]

where

represents a chemical bond.

In some embodiments of the present disclosure, the coordinating groups are selected from amino, carboxylic acid, sulfhydryl, double sulfhydryl, phosphine or phosphine oxide. In the present disclosure, the double sulfhydryl group can be formed from

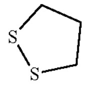

into the structure shown in

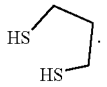

In some embodiments, when the coordinating group is selected from the sulfhydryl group, the S atom in the sulfhydryl group forms a coordination bond with the surface of the ZnSe/CdSe quantum dot body. When the coordinating group is selected from the amino group, the N atom in the amino group forms a coordination bond with the surface of the ZnSe/CdSe quantum dot body.

In some embodiments, the quantum dot ligand is selected from a collection composed of the following structures:

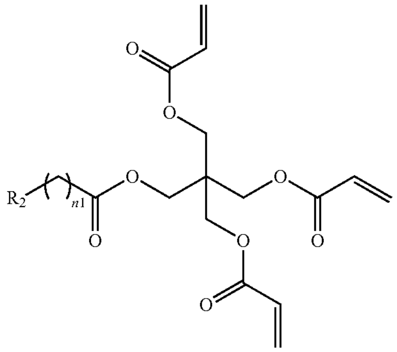

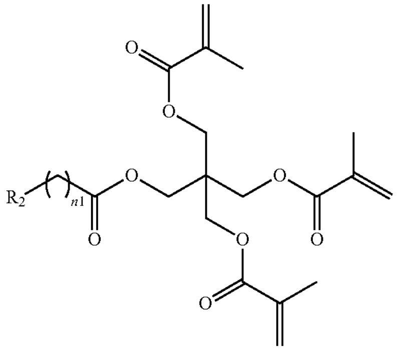

-continued

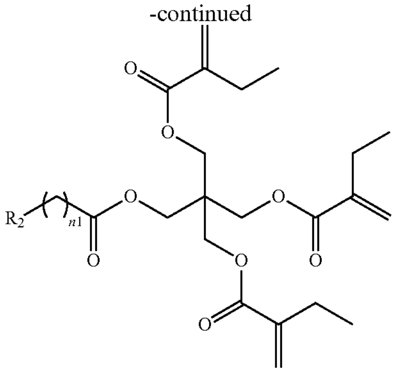

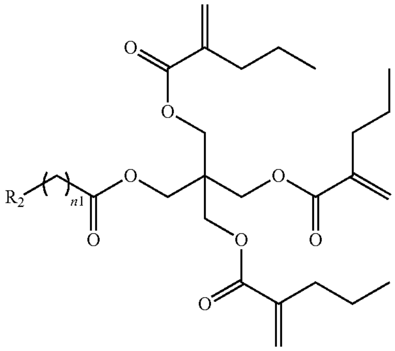

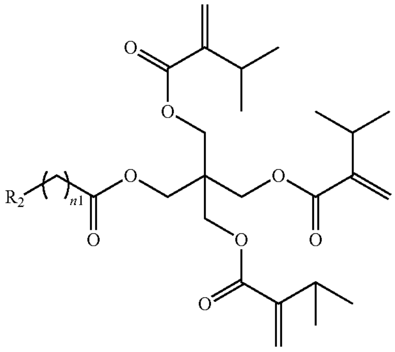

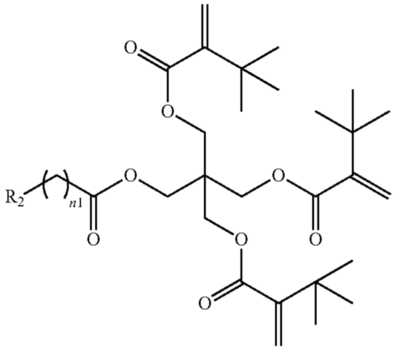

where $R_2$ is selected from amino, carboxylic acid, sulfhydryl, double sulfhydryl, phosphine or phosphine oxide; and n1 is selected from any integer in a range of 2-8.

The present disclosure also provides a quantum dot-ligand material, including a quantum dot body and a quantum dot ligand as described in any of the above embodiments, and a coordination bond is formed between the quantum dot ligand and the quantum dot body.

In some embodiments, the quantum dot-ligand material is selected from a collection composed of the following functional groups:

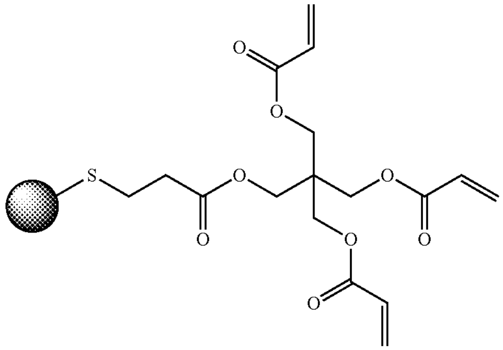

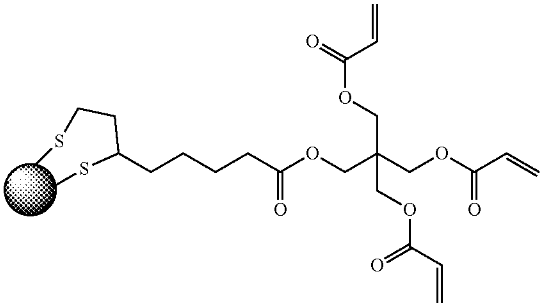

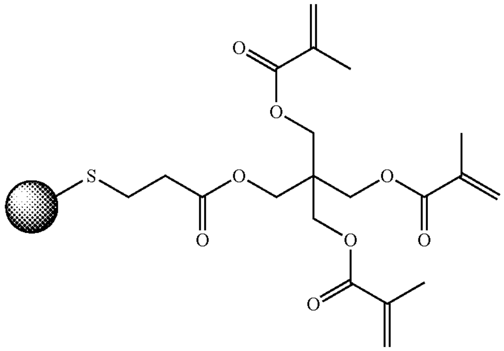

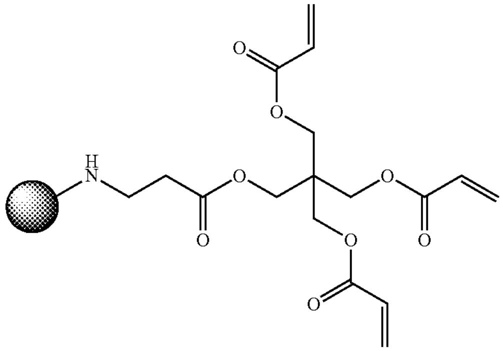

where

represents the quantum dot body.

The quantum dot-ligand material provided in the present disclosure can undergo cross-linking, through a carbon-carbon double bond, between quantum dot ligands wrapped on the surface of the quantum dot body under the action of the photoinitiators and the light, and the cross-linked product is insoluble in the developer.

The present disclosure also provides a quantum dot light-emitting layer, and a material of the quantum dot light-emitting layer includes a first quantum dot body, a second quantum dot body, and a quantum dot ligand of any of the above embodiments.

The quantum dot ligand forms coordination bonds with the first quantum dot body and the second quantum dot body, respectively:

The first quantum dot body and the second quantum dot body are cross linked through the carbon-carbon double bonds of the cross-linkable groups in the quantum dot ligand to form a network structure.

The present disclosure also provides a quantum dot light-emitting device, including the aforementioned quantum dot light-emitting layer.

The quantum dot light-emitting device provided in the present disclosure can be an electroluminescent quantum dot light-emitting device or a photoluminescent quantum dot light-emitting device.

In some embodiments of the present disclosure, the quantum dot light-emitting device further includes an anode, a cathode, a hole injection layer, a hole transport layer, an electron transport layer, and an electron injection layer.

Figure 7:
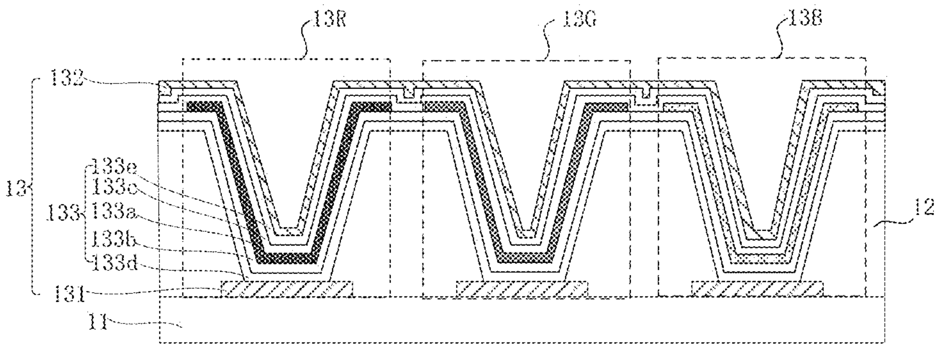
FIG. 7 is a schematic structural diagram of a quantum dot light-emitting device according to embodiments of the present disclosure.

As shown in FIG. 7, in some embodiments of the present disclosure, the quantum dot light-emitting device can include a substrate 11 and a first electrode 131, a hole injection layer 133*d*, a hole transport layer 133*b*, a quantum dot light-emitting layer 133*a*, an electron transport layer 133*c*, an electron injection layer 133*e*, and a second electrode 132, sequentially stacked on a side of the substrate 11.

The substrate 11 can be a component providing a substrate surface where a display apparatus layer DP-OEL is arranged. The substrate 11 can be inorganic materials such as a glass substrate or a metal substrate, organic materials such as polycarbonate, polymethyl methacrylate, polyethylene terephthalate, polyethylene naphthalate, polyamide, polyethersulfone, or combinations thereof, silicon wafers, or composite material layers, etc.

One of the first electrode 131 and the second electrode 132 is the anode and the other is the cathode. For example, the first electrode 131 can be the anode and the second electrode 132 can be the cathode. For example, the first electrode 131 can be the cathode and the second electrode 132 can be the anode.

The anode can include a conductor having a high work function, such as metals, conductive metal oxides, or combinations thereof. The anode can include, for example, metals such as nickel, platinum, vanadium, chromium, copper, zinc, or gold, or their alloys. The conductive metal oxides can be zinc oxide, indium oxide, tin oxide, indium tin oxide (ITO), indium zinc oxide (IZO), or fluorine doped tin oxide. Alternatively, the combination of metal and conductive metal oxides can be ZnO and Al, or $SnO_2$ and Sb, but the present disclosure is not limited to this.

The cathode can include a conductor having a lower work function than the anode, such as metals, conductive metal oxides, and/or conductive polymers. The cathode can include, for example, metals such as aluminum, magnesium, calcium, sodium, potassium, titanium, indium, yttrium, lithium, gadolinium, silver, tin, lead, cesium, barium, or their alloys. The multilayer structure such as LiF/Al, $Li_2O$/Al, Liq/Al, LiF/Ca, and $BaF_2$/Ca, but the present disclosure is not limited to this.

The work function of the anode can be higher than the work function of the cathode, for example, the work function of the anode can be from about 4.5 eV to about 5.0 eV, and the work function of the cathode can be from about 4.0 eV to about 4.7 eV. Within this range, the power function of the anode can be, for example, about 4.6 eV to about 4.9 eV, or about 4.6 eV to about 4.8 eV, and the power function of the cathode can be, for example, about 4.0 eV to about 4.6 eV, or about 4.3 eV to about 4.6 eV.

The first electrode 131 and the second electrode 132 can be transmissive electrodes, partially-transmissive partially-reflective electrodes, or reflective electrodes. The transmissive electrodes or partially-transmissive partially-reflective electrodes can include conductive oxides, such as zinc oxide, indium oxide, tin oxide, indium tin oxide (ITO), indium zinc oxide (IZO), or fluorine doped tin oxide, or a thin metal layer. The reflective electrodes can include reflective metals, such as opaque conductors, such as aluminum (Al), silver (Ag), or gold (Au), and the first electrode and the second electrode can be a single-layer structure or a multi-layer structure.

At least one of the first electrode 131 or the second electrode 132 can be connected to an auxiliary electrode. If connected to the auxiliary electrode, the resistance of the second electrode 132 can be reduced.

The hole transport layer 133*b* and the hole injection layer 133*d* are arranged between the first electrode 131 and the quantum dot light-emitting layer 133*a*. The hole transport layer 133*b* is arranged between the first electrode 131 and the quantum dot light-emitting layer 133*a*, and close to the quantum dot light-emitting layer 133*a*. The hole injection layer 133*d* is arranged between the first electrode 131 and the quantum dot light-emitting layer 133*a*, and close to the first electrode 131. The hole injection layer 133*d* can promote the injection of holes from the first electrode, and the hole transport layer 133*b* can effectively transfer the injected holes to the quantum dot light-emitting layer 133*a*. The hole transport layer 133*b* and the hole injection layer 144*d* can each have one or two or more layers, and can broadly include an electron barrier layer.

The hole transport layer 133*b* and the hole injection layer 133*d* can each have a HOMO energy level between the work function of the first electrode 131 and the HOMO energy level of the quantum dot light-emitting layer 133*a*. In some embodiments, the work function of the first electrode 131, the HOMO energy level of the hole injection layer 133*d*, the HOMO energy level of the hole transport layer 133*b*, and the HOMO energy level of the quantum dot light-emitting layer 133*a* can gradually deepen, and can be stepped, for example.

The hole transport layer 133*b* can have a relatively deep HOMO level to match the HOMO level of the quantum dot light-emitting layer 133*a*. Therefore, the mobility of holes transferred from the hole transport layer 133*b* to the quantum dot layer can be improved.

The HOMO energy level of the hole transport layer 133*b* can be equal to the HOMO energy level of the quantum dot light-emitting layer 133*a*, or less than the HOMO energy level of the quantum dot light-emitting layer 133*a* within a range of from about 1.0 eV or less. For example, the difference between the HOMO energy levels of the hole transport layer 133*b* and the quantum dot light-emitting layer 133*a* can be from about 0 eV to about 1.0 eV, within this range, such as from about 0.01 eV to about 0.8 eV, within this range, such as from about 0.01 eV to about 0.7 eV, within this range, such as from about 0.01 eV to about 0.5 eV, within this range, such as from about 0.01 eV to about 0.4 eV, such as from about 0.01 eV to about 0.3 eV, such as from about 0.01 eV to about 0.2 eV, such as from about 0.01 eV to about 0.1 eV.

The HOMO energy level of the hole transport layer 133*b* can be, for example, greater than or equal to about 5.0 eV, within this range, such as greater than or equal to about 5.2 eV, within this range, such as greater than or equal to about 5.4 eV, within this range, such as greater than or equal to about 5.6 eV, within this range, such as greater than or equal to about 5.8 eV.

For example, the HOMO energy level of the hole transport layer 133*b* can be from about 5.0 eV to about 7.0 eV, within the above range, such as from about 5.2 eV to about 6.8 eV, within the above range, for example, from about 5.4 eV to about 6.8 eV, from about 5.4 eV to about 6.7 eV, from about 5.4 eV to about 6.5 eV, from about 5.4 eV to about 6.3 eV, from about 5.4 eV to about 6.2 eV, from about 5.4 eV to about 6.1 eV, from about 5.6 eV to about 7.0 eV, from about 5.6 eV to about 6.8 eV, from about 5.6 eV to about 6.7 eV, from about 5.6 eV to about 6.5 eV, from about 5.6 eV to about 6.3 eV, from about 5.6 eV to about 6.2 eV, from about 5.6 eV to about 6.1 eV, from about 5.8 eV to about 7.0 eV, from about 5.8 eV to about 6.8 eV, from about 5.8 eV to about 6.7 eV, from about 5.8 eV to about 6.5 eV, from about 5.8 eV to about 6.3 eV, from about 5.8 eV to about 6.2 eV, from about 5.8 eV to about 6.1 eV.

The hole transport layer 133*b* and hole injection layer 133*d* can include materials that satisfy energy levels without special limitations, and can include, for example, at least one selected from the following: poly(9,9-dioctyl-fluorene-co-N-(4-butylphenyl)-diphenylamine) (TFB), poly (N,N'-bis-4-butylphenyl-N,N'-biphenyl)benzidine (poly TPD), polyarylamine (polyarylated compound), poly(N-vinylcarbazole), poly(3,4-ethylenedioxythiophene) (PEDOT), poly(3,4-ethylenedioxythiophene): polystyrene sulfonate (PEDOT: PSS), polyaniline, polypyrrole, N,N,N',N'-tetra(4-methoxyphenyl)-biphenylamine (TPD), 4,4'-bis [N-(1-naphthyl)-N-phenylamino]biphenyl (α-NPD), m-MT-DATA (4,4',4"-tri[phenyl(m-methylphenyl)amino] triphenylamine), 4,4',4"-tri(N-carbazolyl)-triphenylamine (TCTA), 1,1-bis[(di-4-tolylamino)phenyl]cyclohexane (TAPC), p-type metal oxides (such as NiO, WO3, MoO3, etc.), carbon based materials such as graphene oxide, phthalocyanine compounds (such as copper phthalocyanine): N,N'-Diphenyl-N,N'-bis-[4-(phenyl-meta methylphenyl-amino)-phenyl]-biphenyl-4,4'-diamine (DNTPD), 4,4',4"-tri (3-methylphenyl amino)triphenylamine (m-MTDATA), 4,4',4"-tri(N,N-diphenylamino)triphenylamine (TDATA), 4,4',4"-tri{N-(2-naphthyl)-N-phenylamino}-triphenylamine (2-TNATA), poly(3,4-ethylenedioxythiophene)/poly(4-styrene sulfonate ester) (PEDOT/PSS), polyaniline/dodecylbenzenesulfonic acid (PANI/DBSA), polyaniline/camphor sulfonic acid (PANI/CSA), polyaniline/poly(4-phenylene-sulfonate) (PANI/PSS), N,N'-di(naphthalene-1-yl)-N,N'-diphenyl-biphenylamine (NPB), polyether ketone containing triphenylamine (TPAPEK), 4-isopropyl-4'-methyldiphenyliodonium tetra(pentafluorophenyl)borate and/or dipyrimido [2,3-f: 2', 3'-h]qumoxaline-2,3,6,7,10,11-hexamethylnitrile (HAT-CN), carbazole derivatives (such as N-phenylcarbazole and/or polyethylene carbazole), fluorine derivatives, N,N'-bis(3-methylphenyl)-N,N'-diphenyl-[1,1-biphenyl]-4,4'-diamine (TPD), triphenylamine derivatives (such as 4,4',4"-tri(N-carbazolyl)triphenylamine (TCTA)), N, N'-di (naphthalen-1-yl)-N, N'-Diphenyl biphenylamine (NPB), 4,4'-cyclohexylidene bis [N,N-bis (4-methylphenyl)aniline] (TAPC), 4,4'-bis[N,N'-(3-methylphenyl)amino]-3,3'-dimethylbiphenyl (HMTPD), 1,3-bis (N-carbazolyl)benzene (mCP), and combinations thereof, but the present disclosure is not limited to this.

One or both of the hole transport layer and the hole injection layer can be omitted.

One or more suitable methods (such as vacuum deposition, spin coating, tape casting, Langmuir Blodget (LB) method, sputtering, inkjet printing, laser printing, and/or laser-induced thermal imaging (LITI) method can be used to form the hole transport layer 133*b* and the hole injection layer 133*d*.

Quantum dots of different sizes in the quantum dot light-emitting layer can emit light of different colors and form sub-pixels of different colors, such as a first color sub-pixel 13G, a second color sub-pixel 13B, and a third color sub-pixel 12R.

The electron transport layer 133*c* and the electron injection layer 133*e* are arranged between the second electrode 132 and the quantum dot light-emitting layer 133*a*. The electron transport layer 133*c* is arranged between the second electrode 132 and the quantum dot light-emitting layer 133*a*, and close to the quantum dot light-emitting layer 133*a*. The electron injection layer 133*e* is arranged between the second electrode 132 and the quantum dot light-emitting layer 133*a*, and close to the second electrode 132. The electron injection layer 133*e* can promote the injection of electrons from the second electrode, and the electron transport layer 133*c* can effectively transfer the injected electrons to the quantum dot light-emitting layer 133*a*. The electron transport layer 133*c* and the electron injection layer 133*e* can each have one or two or more layers, and can broadly include a hole blocking layer.

In some embodiments, the electron injection layer 133*e* can be in contact with the second electrode 132.

In some embodiments, the electronic transport layer 133*c* can be in contact with the quantum dot light-emitting layer 133*a*.

In some embodiments, the electron transport layer 133*c* and the electron injection layer 133*e* can be in contact with each other. One or both of the electron transport layer and the electron injection layer can be omitted.

In some embodiments, the LUMO energy levels of the second electrode 132, the electron injection layer 133*e*, the electron transport layer 133*c*, and the quantum dot light-emitting layer 133*a* can gradually become shallower. For example, the LUMO energy level of the electron injection layer 133*e* can be shallower than the work function of the second electrode 132, the LUMO energy level of the electron transport layer 133*c* can be shallower than the LUMO energy level of the electron injection layer 133*e*, and the LUMO energy level of the quantum dot light-emitting layer 133*a* can be shallower than the LUMO energy level of the electron transport layer 133*c*. That is, the work function of the second electrode 132, the LUMO energy level of the electron injection layer 133*e*, the LUMO energy level of the electron transport layer 133*c*, and the LUMO energy level of the quantum dot light-emitting layer 133*a* can have a gradually decreasing order (cascade) energy level in one direction.

The electronic transport layer 133*c* can include first inorganic nanoparticles. The first inorganic nanoparticles can be, for example, oxide nanoparticles, and can be, for example, metal oxide nanoparticles.

The first inorganic nanoparticle can be a two-dimensional or three-dimensional nanoparticle with an average particle diameter of less than or equal to about 10 nm, within this range, less than or equal to about 8 nm, less than or equal to about 7 nm, less than or equal to about 5 nm, less than or equal to about 4 nm, or less than or equal to about 3.5 nm, or within this range, from about 1 nm to about 10 nm, from about 1 nm to about 9 nm, from about 1 nm to about 8 nm, from about 1 nm to about 7 nm, from about 1 nm to about 5 nm, from about 1 nm to about 4 nm, or from about 1 nm to about 3.5 nm.

In some embodiments, the first inorganic nanoparticle can be a metal oxide nanoparticle, which includes at least one of zinc (Zn), magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), hafnium (Hf), and barium (Ba).

In some embodiments, the first inorganic nanoparticle can include a metal oxide nanoparticle containing zinc (Zn), and can include the metal oxide nanoparticle represented by Zn1-xQxO ($0 \leq x < 0.5$). In some embodiments, Q represents at least one metal different from Zn, such as magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), hafnium (Hf), silicon (Si), barium (Ba), or combinations thereof.

In some embodiments, Q can include magnesium (Mg).

In some embodiments, x can be within a range of $0.01 \leq x \leq 0.3$, for example, $0.01 \leq x \leq 0.2$.

The LUMO energy level of the electron transport layer 16 can be a value between the LUMO energy level of the quantum dot light-emitting layer 133*a* and the LUMO energy level of the electron injection layer 17, and can be about 3.2 eV to about 4.8 eV, about 3.2 eV to about 4.6 eV, about 3.2 eV to about 4.5 eV, about 3.2 eV to about 4.3 eV, about 3.2 eV to about 4.1 eV, about 3.4 eV to about 4.1 eV, about 3.5 eV to about 4.6 eV, about 3.6 eV to about 4.6 eV, about 3.6 eV to about 4.3 eV, about 3.6 eV to about 4.1 eV, about 3.6 eV to about 3.9 eV eV, about 3.7 eV to about 4.6 eV, about 3.7 eV to about 4.3 eV, about 3.7 eV to about 4.1 eV, or about 3.7 eV to about 3.9 eV.

A thickness of the electronic transport layer 133*c* can be greater than about 10 nm and less than or equal to about 80 nm, and within this range, greater than about 10 nm and less than or equal to about 70 nm, greater than about 10 nm and less than or equal to about 60 nm, greater than about 10 nm and less than or equal to about 50 nm, greater than about 10 nm and less than or equal to about 40 nm, or greater than about 10 nm and less than or equal to about 30 nm.

The LUMO energy level of the electron injection layer 133*e* can be between the work function of the second electrode 132 and the LUMO energy level of the electron transport layer. For example, the difference between the work function of the second electrode 132 and the LUMO energy level of the electron injection layer 133*e* can be less than about 0.5 eV, from about 0.001 eV to about 0.5 eV, from about 0.001 eV to about 0.4 eV, or from about 0.001 eV to about 0.3 eV. In some embodiments, the difference between the LUMO energy level of the electron injection layer 133*e* and the LUMO energy level of the electron transport layer can be less than about 0.5 eV, from about 0.001 eV to about 0.5 eV, from about 0.001 eV to about 0.4 eV, or from about 0.001 eV to about 0.3 eV. Therefore, electrons can be easily injected from the second electrode 132 into the electron injection layer 133*e* to reduce the driving voltage of the quantum dot device, and electrons can be effectively transferred from the electron injection layer 133*e* to the electron transport layer to improve efficiency. Within a range of meeting the aforementioned energy levels, the LUMO energy level of the electron injection layer can be from about 3.4 eV to about 4.8 eV, from about 3.4 eV to about 4.6 eV, from about 3.4 eV to about 4.5 eV, from about 3.6 eV to about 4.8 eV, from about 3.6 eV to about 4.6 eV, from about 3.6 eV to about 4.5 eV, from about 3.6 eV to about 4.3 eV, from about 3.9 eV to about 4.8 eV, from about 3.9 eV to about 4.6 eV, from about 3.9 eV to about 4.5 eV, or from about 3.9 eV to about 4.3 eV.

The electron injection layer 133*e* can be thinner than the electron transport layer 133*c*. For example, a thickness of the electron injection layer 133*e* can be about 0.01 to about 0.8 times, about 0.01 to about 0.7 times, about 0.01 to about 0.5 times, about 0.1 to about 0.8 times, about 0.1 to about 0.7 times, or about 0.1 to about 0.5 times a thickness of the electron transport layer 133*c*. The thickness of the electron injection layer 17 can be, for example, less than or equal to about 10 nm, less than or equal to about 7 nm, or less than or equal to about 5 nm. Within this range, the thickness of the electron injection layer 17 can be from about 1 nm to about 10 nm, from about 1 nm to about 8 nm, from about 1 nm to about 7 nm, or from about 1 nm to about 5 nm.

One or more suitable methods (such as vacuum deposition, spin coating, tape casting, Langmuir Blodget (LB) method, inkjet printing, sputtering, laser printing, and/or laser-induced thermal imaging (LITI)) method can be used to form the electron transport layer 133*c* and the electron injection layer 133*e*.

In some embodiments of the present disclosure, the quantum dot light-emitting device can also be a photoluminescent quantum dot device containing a light-emitting unit, with the quantum dot light-emitting layer being arranged on a side of the light-emitting unit.

Figure 8:
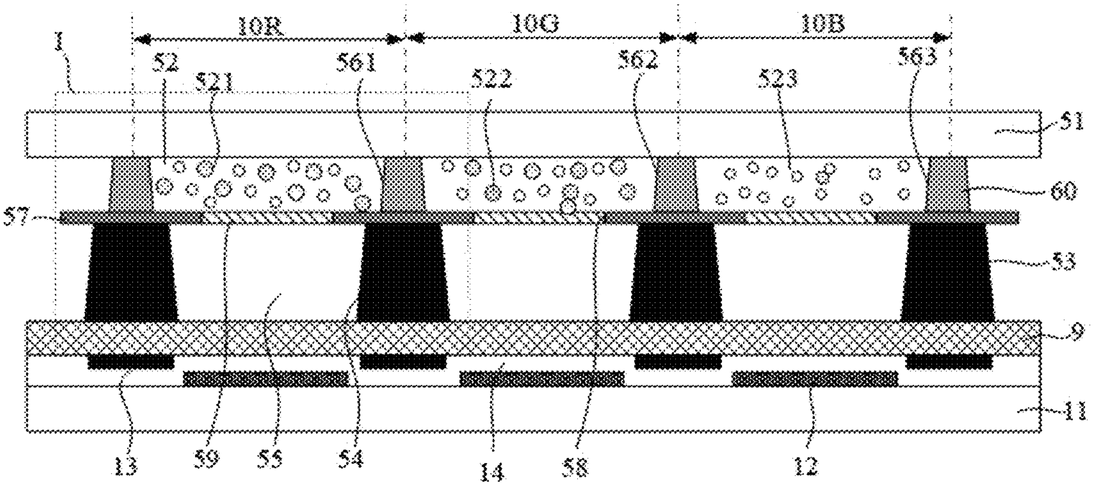
FIG. 8 is a schematic structural diagram of a quantum dot light-emitting device according to embodiments of the present disclosure.

As shown in FIG. 8, the quantum dot light-emitting device according to embodiments of the present disclosure can include a first substrate and a second substrate. The first substrate and the second substrate can be arranged relative to each other. For example, the first substrate can be a substrate provided with a light source and other components, and the second substrate can be a substrate provided with a color film and other components.

The first substrate can include a first substrate 11 and multiple light-emitting units 12 arranged on the first substrate 11.

The second substrate can include: a second substrate 51; a quantum dot light-emitting layer arranged on the second substrate 51, the quantum dot light-emitting layer at least including multiple quantum dot structures; multiple extinction structures 53 arranged on a side of the quantum dot light-emitting layer facing towards the first substrate, a first channel 54 being formed between any two adjacent extinction structures 53; and multiple first optical structures 55 arranged on a side of the quantum dot light-emitting layer facing towards the first substrate, the multiple first optical structures 55 are respectively located in the first channel 54 between any two adjacent extinction structures 53.

The quantum dot light-emitting device can further include a filled material part 9 arranged between the first substrate and the second substrate.

In embodiments of the present disclosure, a refractive index of a material of the filled material part 9 is greater than a refractive index of a material of the first optical structure 55. The extinction structure 53 includes an absorbing material.

As shown in FIG. 8, orthographic projections of the multiple light-emitting units 12 on the first substrate 11 at least partially overlap with orthographic projections of the multiple first optical structures 55 on the first substrate 11. An orthographic projection of the quantum dot light-emitting layer on the first substrate 11 at least partially overlaps with the orthographic projections of the multiple first optical structures 55 on the first substrate 11. The orthographic projections of the multiple first optical structures 55 on the first substrate 11 fall within an orthographic projection of the filled material part 9 on the first substrate 11. The first substrate 11 and the second substrate 51 can be rigid or flexible substrates, including but not limited to glass substrates or polyimide (PI) substrates.

In embodiments of the present disclosure, the multiple light-emitting units 12 can include multiple organic light-emitting diodes or multiple inorganic light-emitting diodes, such as Mini LEDs or Micro LEDs.

In embodiments of the present disclosure, the quantum dot light-emitting device can include multiple sub-pixels 1, such as an area surrounded by a dashed box. The sub-pixel 1 can be a third color sub-pixel 10R for emitting light having a first wavelength range, a first color sub-pixel 10G for emitting light having a second wavelength range, and a second color sub-pixel 10B for emitting light having a third wavelength range. Each sub-pixel can include a sub-pixel opening. For example, the third color sub-pixel 10R can include a first sub-pixel opening 561, the first color sub-pixel 10G can include a second sub-pixel opening 562, and the second color sub-pixel 10B can include a third sub-pixel opening 563. The first color, the second color, and the third color can refer to green, blue, and red respectively. In some embodiments, the quantum dot light-emitting device can also include pixels for emitting other colors, such as pixels emitting yellow light, which are not specially limited in embodiments of the present disclosure.

The quantum dot light-emitting layer can include multiple quantum dot structures for emitting different colors, and the quantum dot structure includes the first unit in the present disclosure. If the quantum dot structure includes the quantum dot body and the first unit, the first unit is bound to a surface of the quantum dot body. For example, the third color sub-pixel 10R can include a first quantum dot structure 521 for emitting light having a first wavelength range, and the first color sub-pixel 10G can include a second quantum dot structure 522 for emitting light having a second wavelength range. In some embodiments, the quantum dot light-emitting layer can also include quantum dot structures for emitting light having other wavelength ranges, such as quantum dot structures emitting yellow light.

The second substrate can further include multiple light blocking structures 57 arranged on the second substrate 51, and the multiple light blocking structures 57 are located between a layer where the extinction structures 53 are located and a layer where the quantum dot light-emitting layer 52 is located. For example, the light blocking structure 57 includes a light blocking material.

A second channel 58 is formed between any two adjacent light blocking structures 57. An orthographic projection of the second channel 58 on the second substrate 51 falls within an orthographic projection of the first channel 54 on the second substrate 51. Multiple first channels 54 and multiple second channels 58 are connected respectively to form multiple light incoming channels.

The second substrate can further include multiple quantum dot protection structures 59 arranged on the second substrate 51. The multiple quantum dot protection structures 59 are located between the quantum dot light-emitting layer 52 and the first optical structures 55. Orthographic projections of the multiple quantum dot protection structures 59 on the second substrate 51 are respectively located within orthographic projections of the multiple second channels 58 on the second substrate 51. In this way, the multiple quantum dot protection structures 59 respectively protect the quantum dot structures located in each pixel opening.

The second substrate can further include multiple blocking wall structures 60 arranged on the second substrate 51. The multiple blocking wall structures 60 are located between the second substrate 51 and the multiple extinction structures 53. Orthogonal projections of the multiple blocking wall structures 60 on the second substrate 51 are respectively located within orthogonal projections of the multiple extinction structures 53 on the second substrate 51.

The above-mentioned pixel openings 561, 562, and 563 are located between any two adjacent blocking wall structures 60. Orthogonal projections of each pixel opening 561, 562, and 563 on the first substrate 11 cover orthogonal projections of the multiple light incoming channels on the first substrate 11, and the orthogonal projections of each pixel opening 561, 562, and 563 on the first substrate 11 cover orthogonal projections of the multiple light-emitting units 12 on the first substrate 11, respectively.

The present disclosure also provides a method for preparing a quantum dot light-emitting device, and includes following steps.

A first color mixed solution is provided. The first color mixed solution includes a photoinitiator and a first color quantum dot-ligand material. The first color quantum dot-ligand material includes a first color quantum dot body and the quantum dot ligand in the aforementioned embodiments, and a coordination bond is formed between the first color quantum dot ligand and the first color quantum dot body.

A second color mixed solution is provided. The second color mixed solution includes a photoinitiator and a second color quantum dot-ligand material. The second color quantum dot-ligand material includes a second color quantum dot body and the quantum dot ligand in the aforementioned embodiments, and a coordination bond is formed between the second color quantum dot ligand and the second color quantum dot body.

The first color mixed solution is coated on the substrate, for exposure and development, to form a first color sub-pixel.

The second color mixed solution is coated on the substrate, for exposure and development, to form a second color sub-pixel.

The method for preparing the quantum dot light-emitting device in embodiments of the present disclosure further includes following steps.

A third color mixed solution is provided. The third color solution includes a photoinitiator and a third color quantum dot-ligand material. The third color quantum dot-ligand material includes a third color quantum dot body and the quantum dot ligand in the aforementioned embodiments, and a coordination bond is formed between the third color quantum dot ligand and the quantum dot body.

The third color mixed solution is applied on the substrate for exposure and development to form a third color sub-pixel.

The first color, the second color, and the third color in the present disclosure only indicate that they are different colors from each other, but there are no special limitations on what specific colors they represent.

The present disclosure also provides a display apparatus including the aforementioned quantum dot light-emitting device. The display apparatus in the present disclosure can be electronic devices such as mobile phones, tablets, televisions, etc., and will not be listed one by one here.

Example of Quantum Dot-Ligand Material Synthesis:

In the present disclosure, the quantum dot-ligand material can be first synthesized as the quantum dot ligand and then replaced with the quantum dot of an oleic acid ligand. The specific implementation examples are as follows.

1. The quantum dot-ligand material

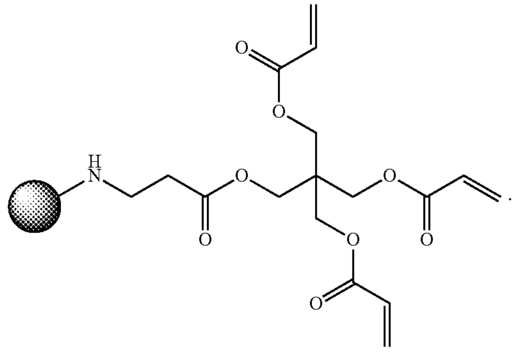

(1) The quantum dot ligand is synthesized

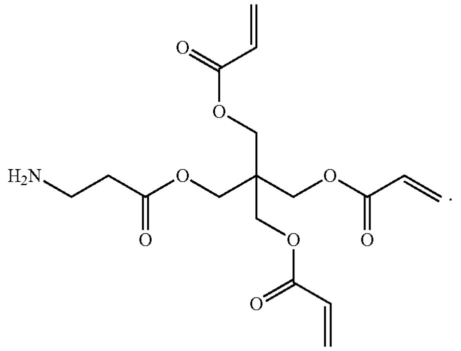 [SMILES: C=CC(=O)OCC(COC(=O)C=C)(COC(=O)C=C)COC(=O)CCN]

A synthesis route is as follows:

Product a

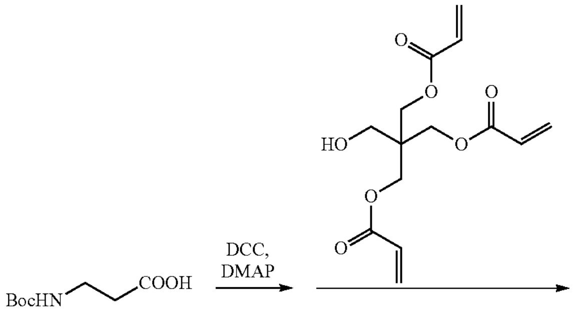

-continued

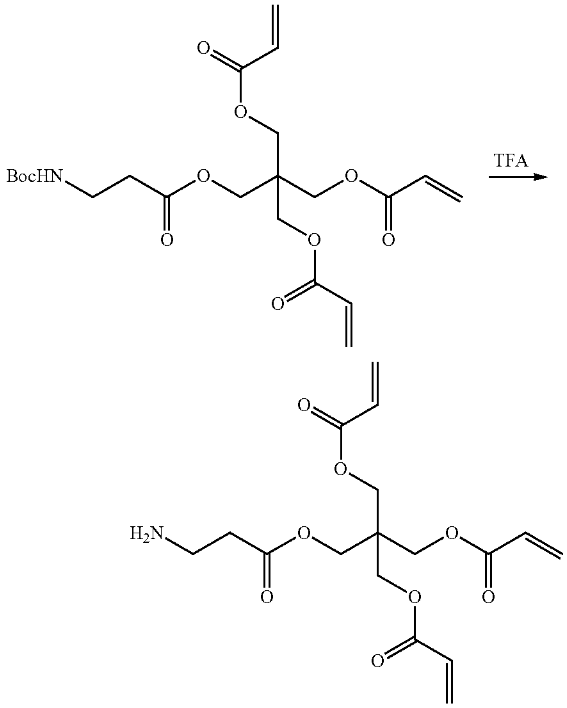

The specific synthesis method is as follows:

(a) Boc-β-Alanine, DCC (dicyclohexylcarbodiimide), and DMAP (4-dimethylaminopyridine) are dissolved in dichloromethane and stirred at room temperature for 1 hour.

Pentaerythritol triacrylate is dissolved in DCM (dichloromethane), added dropwise to the aforementioned solution, and stirred at room temperature for 12 hours. Afterwards, the reaction system is purified using a short silica gel column, and the product a is obtained by rotary evaporation and drying.

(b) The product from step (a) is dissolved in anhydrous DCM, TFA (trifluoroacetic acid) is added at 0° C., the temperature is naturally raised to the room temperature, and is reacted for 12 hours. The quantum dot ligand is obtained by rotary evaporation and drying.

(2) The quantum dot-ligand material is formed.

The specific synthesis route is as follows:

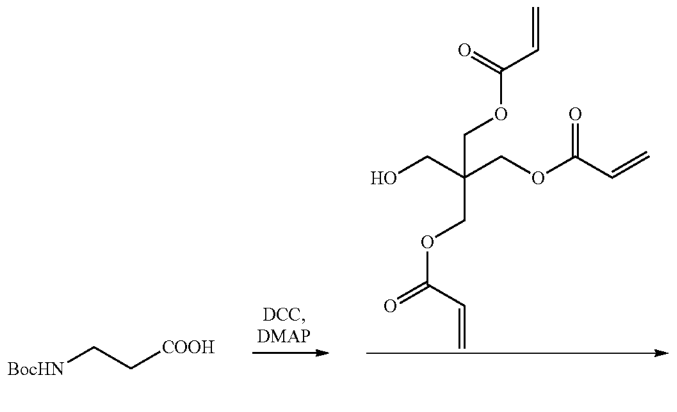

-continued

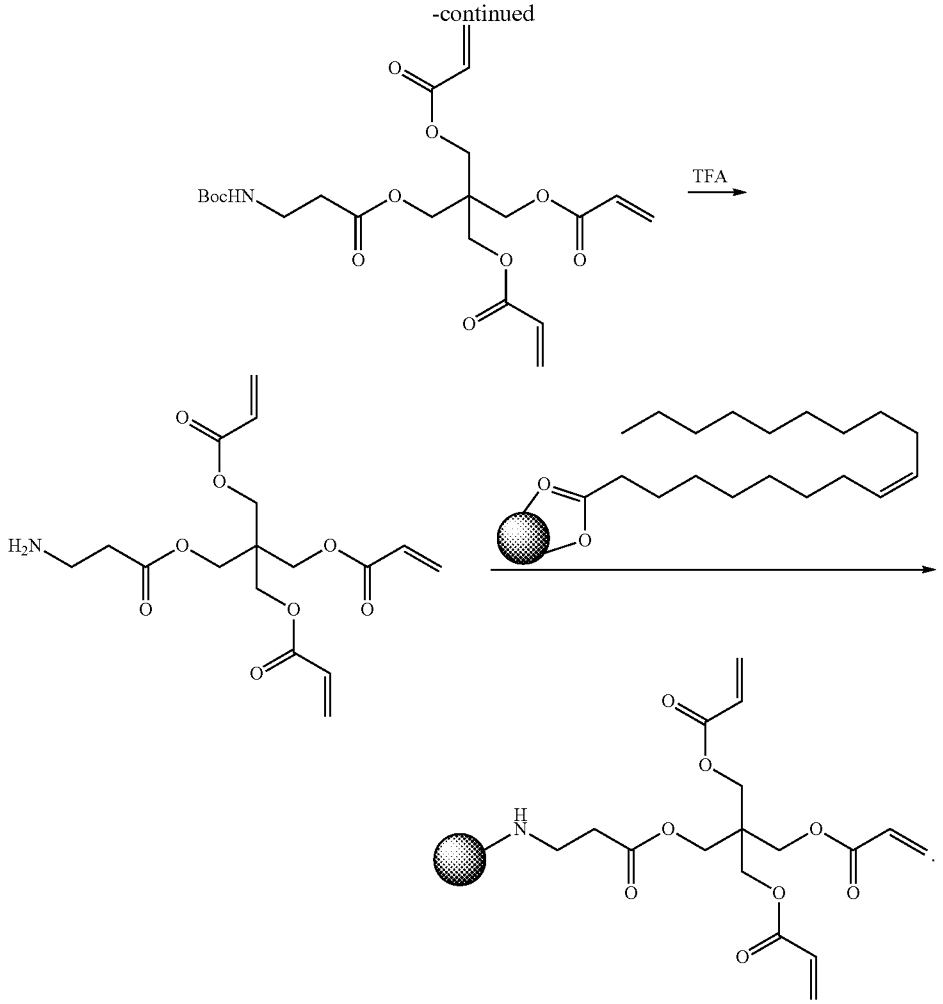

CdZnSe/ZnSe quantum dots of the oleic acid ligand are suspended in PGMEA (propylene glycol methyl ether acetate), the product from step (b) is added, stirred in a dark nitrogen environment for 24 hours, and precipitated with methanol. After dissolved with PGMEA/precipitated with methanol twice, it is dissolved in PGMEA to obtain a solution of the quantum dot-ligand material.

2. The quantum dot-ligand material

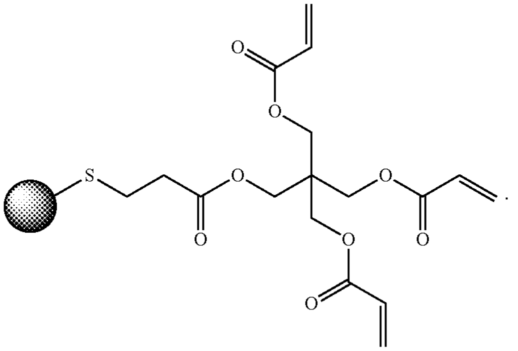 [SMILES: C=CC(=O)OCC(COC(=O)C=C)(COC(=O)C=C)COC(=O)CCSC]

(1) The quantum dot ligand is synthesized

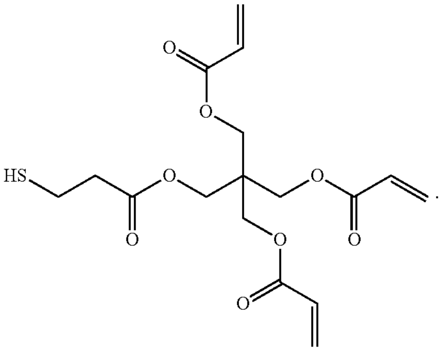 [SMILES: C=CC(=O)OCC(COC(=O)C=C)(COC(=O)C=C)COC(=O)CCS]

A synthesis route is as follows:

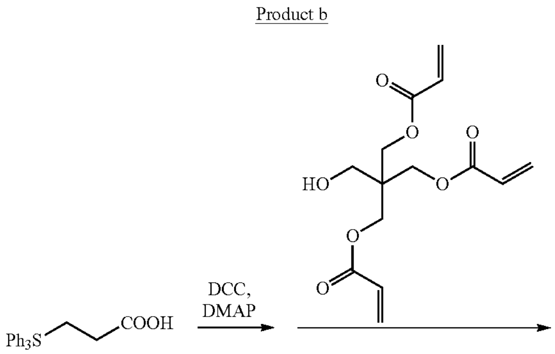

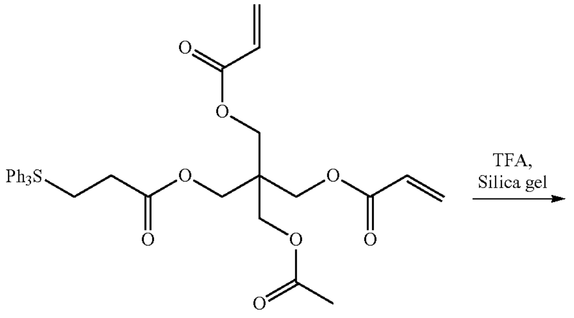

-continued

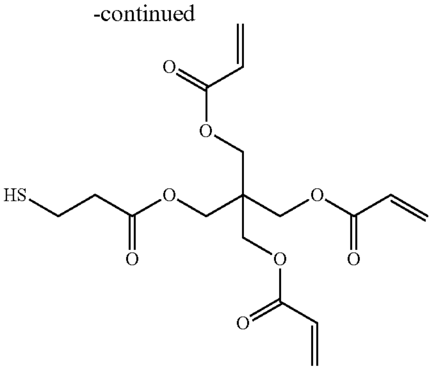

The specific synthesis method is as follows:

(a) Triphenylthiopropionic acid, DCC (dicyclohexylcarbodiimide), and DMAP (4-dimethylaminopyridine) are dissolved in dichloromethane and stirred at room temperature for 1 hour.

Pentaerythritol triacrylate is dissolved in DCM (dichloromethane), added dropwise to the aforementioned solution, and stirred at room temperature for 12 hours. Afterwards, the reaction system is purified using a short silica gel column, and the product a is obtained by rotary evaporation and drying.

(b) The product from step (a) is dissolved in anhydrous DCM, TFA (trifluoroacetic acid) is added at 0° C., the temperature is naturally raised to the room temperature, and is reacted for 12 hours. The quantum dot ligand is obtained by rotary evaporation and drying.

(2) The quantum dot-ligand material is formed.

The specific synthesis route is as follows:

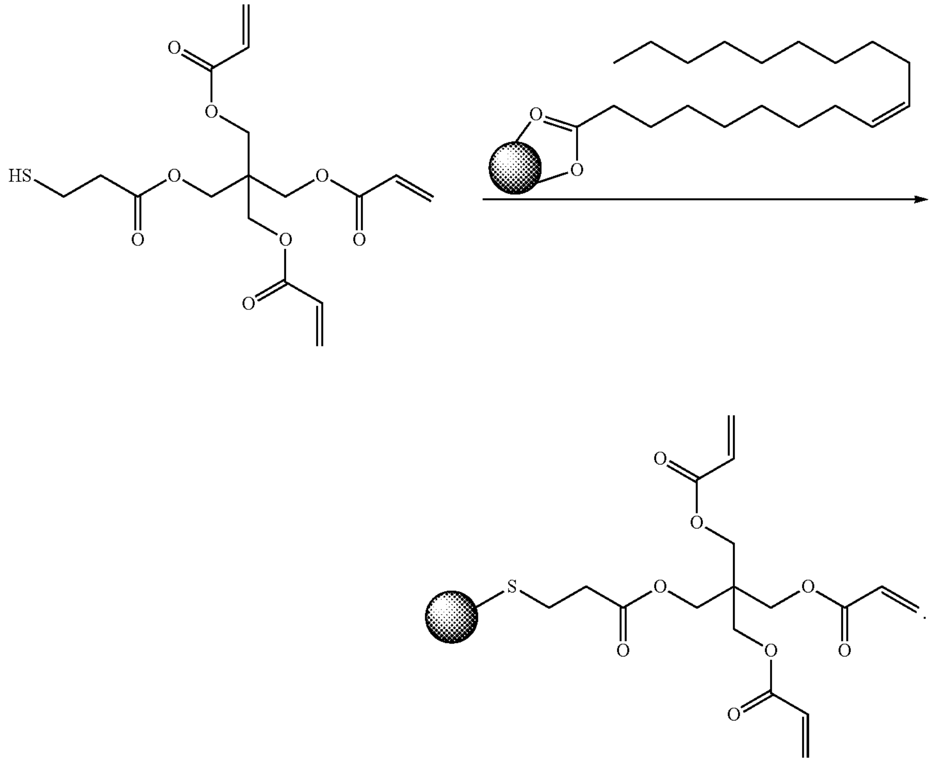

CdZnSe/ZnSe quantum dots of the oleic acid ligand are suspended in PGMEA (propylene glycol methyl ether acetate), the product from step (b) is added, stirred in a dark nitrogen environment for 24 hours, and precipitated with methanol. After dissolved with PGMEA/precipitated with methanol twice, it is dissolved in PGMEA to obtain a solution of the quantum dot-ligand material.

In addition, the quantum dot-ligand material in the present disclosure can also be synthesized through other synthetic routes, with specific reference to the following content:

3. The quantum dot-ligand material

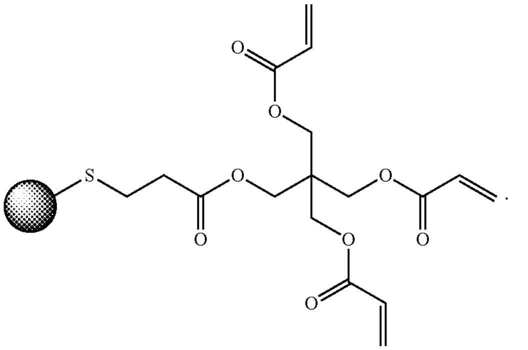 [SMILES: C=CC(=O)OCC(COC(=O)C=C)(COC(=O)C=C)COC(=O)CCSC]

A synthesis route is as follows:

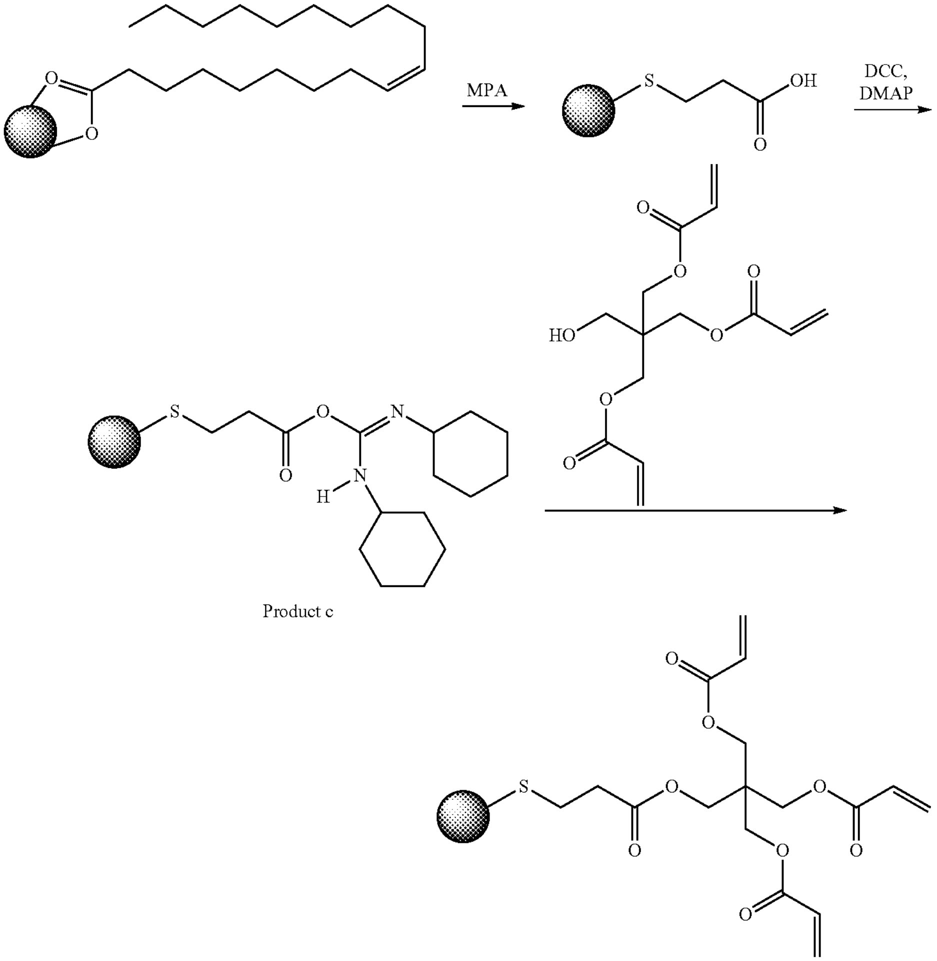

Product c

The synthesis method is:

(1) CdZnSe/ZnSe quantum dots of the oleic acid ligand is used, a phase transfer agent for MPA (mercaptopropionic acid)-methanol is prepared, and the pH is adjusted to 11-12 using sodium hydroxide solution. The quantum dot solution is added to the phase transfer agent and stirred thoroughly. An equal volume of deionized water is added, stirred for 10 minutes, and centrifuged for cleaning, with being centrifuged twice using a mixture solvent of acetone/methanol. It is redispersed into the deionized water, an aqueous solution of quantum dot-MPA, where MPA is a carboxylate ion, —COO—.

(2) An HCl/methanol solution is added to the aqueous solution of the quantum dot obtained in step (1), the pH is adjusted to 5, centrifuged and the sediment is collected, and the supernatant is removed. The precipitate is dispersed into anhydrous DMSO (dimethyl sulfoxide) and a 20 mg/mL quantum dot-MPA solution is prepared, where the carboxylate ion is protonated into —COOH.

(3) DCC and DMAP are dissolved in DMSO, added dropwise to the solution in step (2), and stirred at room temperature for 2 hours, to obtain product c.

(4) Pentaerythritol triacrylate is dissolved in DMSO, added to the reaction system in step (3), and stirred at room temperature for 24 hours. The cyclohexane is added, quantum dots are precipitated from the reaction system, centrifuged and collected. It is dissolved using the ethanol, and precipitated using the cyclohexane, repeated 3 times. Finally, the quantum dots are dispersed in PGMEA to obtain a quantum dot-ligand material solution.

4. The quantum dot-ligand material

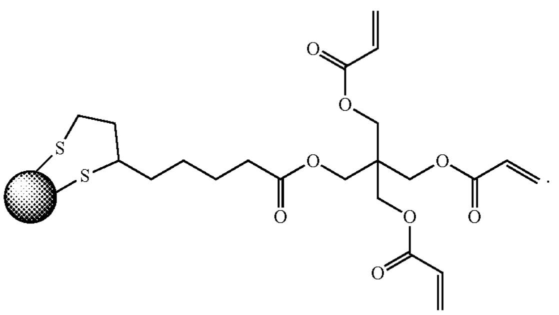 [SMILES: C=CC(=O)OCC(COC(=O)C=C)(COC(=O)C=C)COC(=O)CCCCC(CCSC)SC]

A synthesis route is as follows:

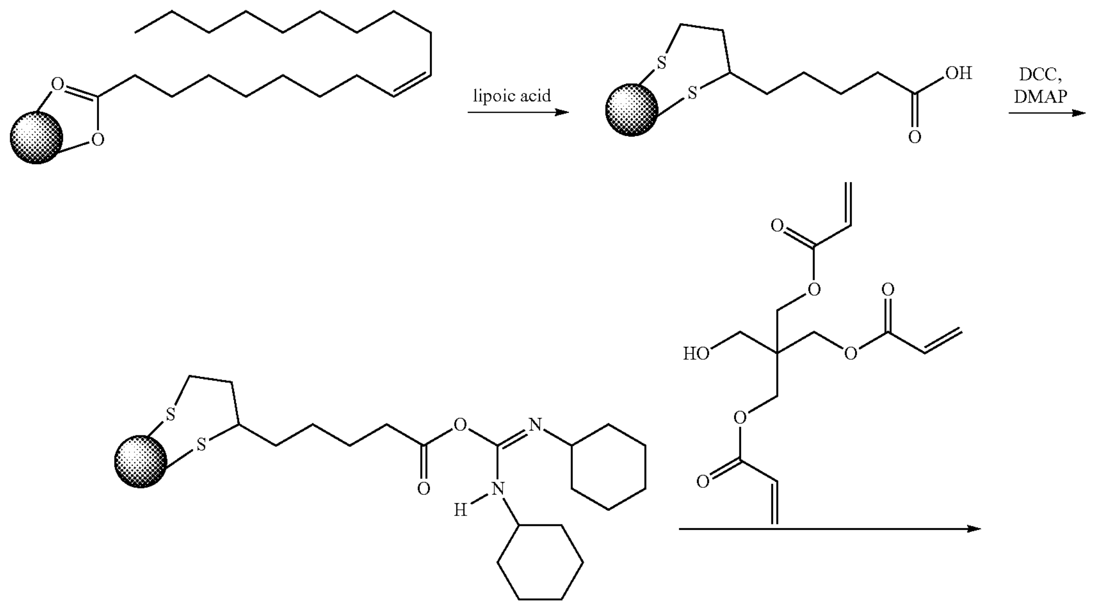

Product d

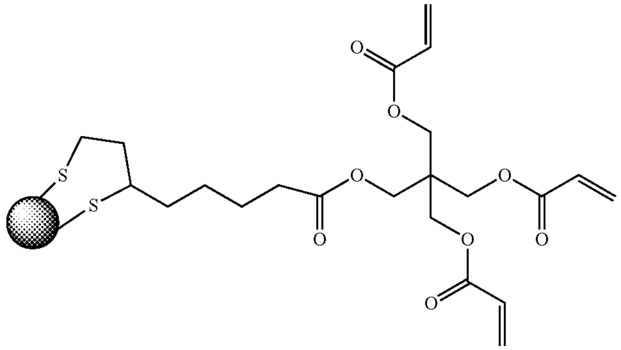

The synthesis method is:

CdZnSe/ZnSe quantum dots of the oleic acid ligand is used, a phase transfer agent for dihydrolipoic acid-methanol is prepared, and the pH is adjusted to 11-12 using sodium hydroxide solution. The quantum dot solution is added to the phase transfer agent and stirred thoroughly. An equal volume of deionized water is added, stirred for 10 minutes, and centrifuged for cleaning, with being centrifuged twice using a mixture solvent of acetone/methanol. It is redispersed into the deionized water, an aqueous solution of quantum dot-MPA, where MPA is a carboxylate ion, —COO—.

(2) An HCL/methanol solution is added to the aqueous solution of the quantum dot obtained in step (1), the pH is adjusted to 5, centrifuged and the sediment is collected, and the supernatant is removed. The precipitate is dispersed into anhydrous DMSO (dimethyl sulfoxide) and a 20 mg/mL quantum dot-MPA solution is prepared, where the carboxylate ion is protonated into —COOH.

(3) DCC and DMAP are dissolved in DMSO, added dropwise to the solution in step (2), and stirred at room temperature for 2 hours, to obtain product d.

(4) Pentaerythritol triacrylate is dissolved in DMSO, added to the reaction system in step (3), and stirred at room temperature for 24 hours. The cyclohexane is added, quantum dots are precipitated from the reaction system, centrifuged and collected. It is dissolved using the ethanol, and precipitated using the cyclohexane, repeated 3 times. Finally, the quantum dots are dispersed in PGMEA to obtain a quantum dot-ligand material solution.

5. The quantum dot-ligand material

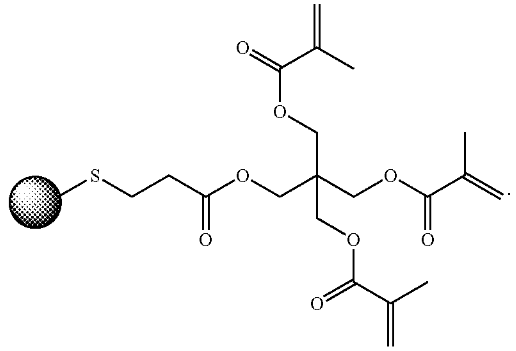 [SMILES: C=C(C)C(=O)OCC(COC(=O)CCSC)(COC(=O)C(=C)C)COC(=O)C(=C)C]

A synthesis route is as follows:

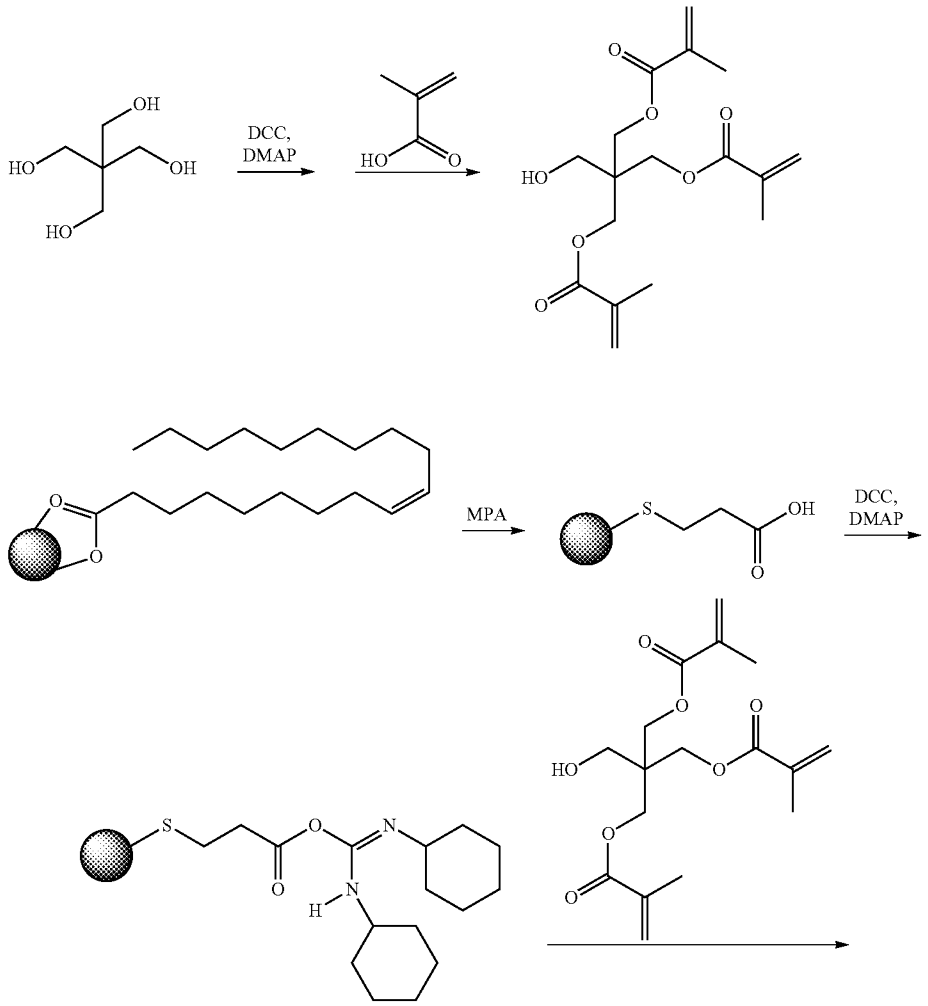

Product e

-continued

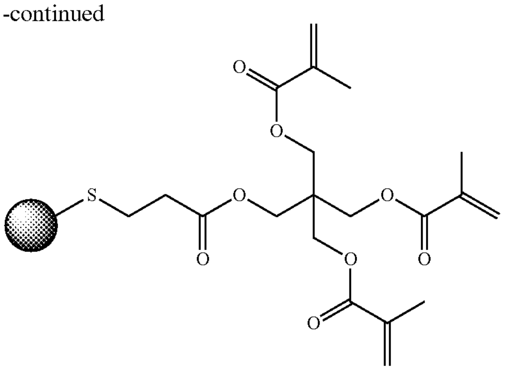

(1) Pentaerythritol is dissolved in anhydrous dichloromethane and cooled to 0° C. DCC and DMAP are dissolved in the anhydrous dichloromethane, and a pentaerythritol solution is added dropwise at 0° C. It heats up naturally to room temperature and is stirred for 1 hour. Then a DCM solution of acrylic acid is added, and reacts for 12 hours to obtain the product.

(2) CdZnSe/ZnSe quantum dots of the oleic acid ligand is used, a phase transfer agent for MPA (mercaptopropionic acid)-methanol is prepared, and the pH is adjusted to 11-12 using sodium hydroxide solution. The quantum dot solution is added to the phase transfer agent and stirred thoroughly. An equal volume of deionized water is added, stirred for 10 minutes, and centrifuged for cleaning, with being centrifuged twice using a mixture solvent of acetone/methanol. It is redispersed into the deionized water, an aqueous solution of quantum dot-MPA, where MPA is a carboxylate ion, —COO—.

(3) An HCl/methanol solution is added to the aqueous solution of the quantum dot obtained in step (2), the pH is adjusted to 5, centrifuged and the sediment is collected, and the supernatant is removed. The precipitate is dispersed into anhydrous DMSO (dimethyl sulfoxide) and a 20 mg/mL quantum dot-MPA solution is prepared, where the carboxylate ion is protonated into —COOH.

(4) DCC and DMAP are dissolved in DMSO, added dropwise to the solution in step (3), and stirred at room temperature for 2 hours, to obtain product e.

(5) The product from step (1) is dissolved in DMSO, added to the reaction system in step (4), and stirred at room temperature for 24 hours. The cyclohexane is added, quantum dots are precipitated from the reaction system, centrifuged and collected. It is dissolved using the ethanol, and precipitated using the cyclohexane, repeated 3 times. Finally, the quantum dots are dispersed in PGMEA to obtain a quantum dot-ligand material solution.

The above synthesis formulas and methods for the quantum dot-ligand material are only illustrative examples of the methods for synthesizing the quantum dot ligand or the quantum dot-ligand material disclosed in the present disclosure. Those skilled in the art can refer to the above methods to synthesize other quantum dot ligands or quantum dot-ligand materials protected by the present disclosure.

The quantum dot light-emitting layer is formed through a photolithography process.

1) A first color mixed solution, a second color mixed solution, and a third color mixed solution are provided. Each color mixed solution includes a photoinitiator and a quantum dot-ligand material corresponding to its color. The quantum dot-ligand material can be prepared using the method described in the above embodiments.

2) The mixed solution of different colors is coated on the substrate and exposed, so that the carbon-carbon double bonds in the cross-linkable groups of the quantum dot-ligand material are cross linked.

3) The development processing is performed to form a quantum dot light-emitting layer.

Steps 2) and 3) can specifically include the following operations.

Figure 2:
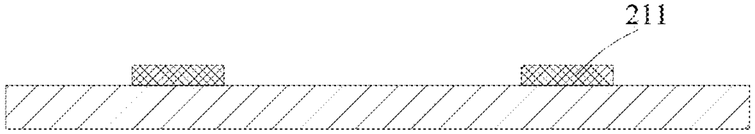
FIG. 2 is a schematic structural diagram of forming a first color sub-pixel according to embodiments of the present disclosure.

As shown in FIGS. 1 to 2, a first color mixed solution is coated on the substrate 1 to form a first color quantum dot film layer 21. The first patterning (Photo Mask) process is applied, and the first color quantum dot film layer 21 is exposed in whole using ultraviolet light. Afterwards, a solvent mixed by one or more of ethanol, isopropanol, propanol, n-butanol, DMF. DMSO is used as the developer for rinsing and development. After the development, the substrate is heated again in a 90° C. environment for 120 seconds to remove the developer and to form a first color sub-pixel 211.

Figure 3:
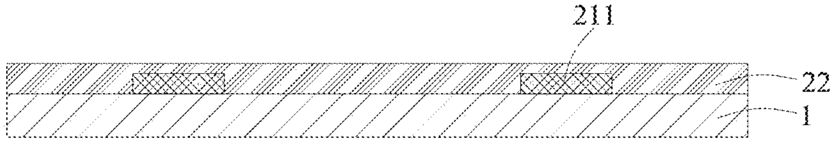
FIG. 3 is a schematic structural diagram of second color quantum dot ligand solution being coated on a substrate according to embodiments of the present disclosure.
Figure 4:
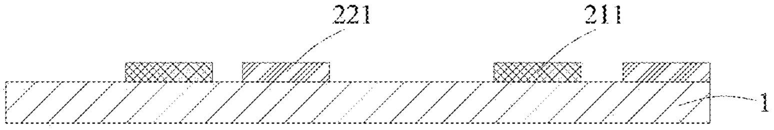
FIG. 4 is a schematic structural diagram of forming a second color sub-pixel according to embodiments of the present disclosure.

As shown in FIGS. 3 to 4, a second color mixed solution is coated to form a second color quantum dot film layer 22. A second Photo Mask is applied, and the second color quantum dot film layer 22 is exposed in whole using ultraviolet light, then developed and fixed to form a second color sub-pixel 221.

Figure 5:
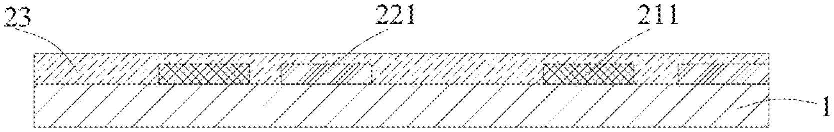
FIG. 5 is a schematic structural diagram of third color quantum dot ligand solution being coated on a substrate according to embodiments of the present disclosure.
Figure 6:
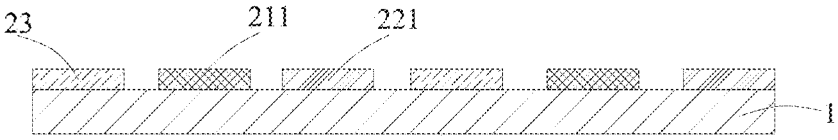
FIG. 6 is a schematic structural diagram of forming a third color sub-pixel according to embodiments of the present disclosure.

As shown in FIGS. 5 to 6, a third color mixed solution is finally coated to form a third color quantum dot film layer 23. A third Photo Mask is applied, and the third color quantum dot film layer 23 is exposed in whole using ultraviolet light, then developed and fixed to form a third color sub-pixel 231.

The quantum dot-ligand material

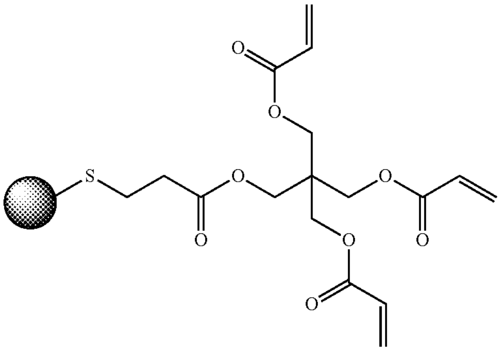 [SMILES: C=CC(=O)OCC(COC(=O)C=C)(COC(=O)C=C)COC(=O)CCSC]

is taken as an example, the reaction of the quantum dot-ligand material after exposure is as follows:

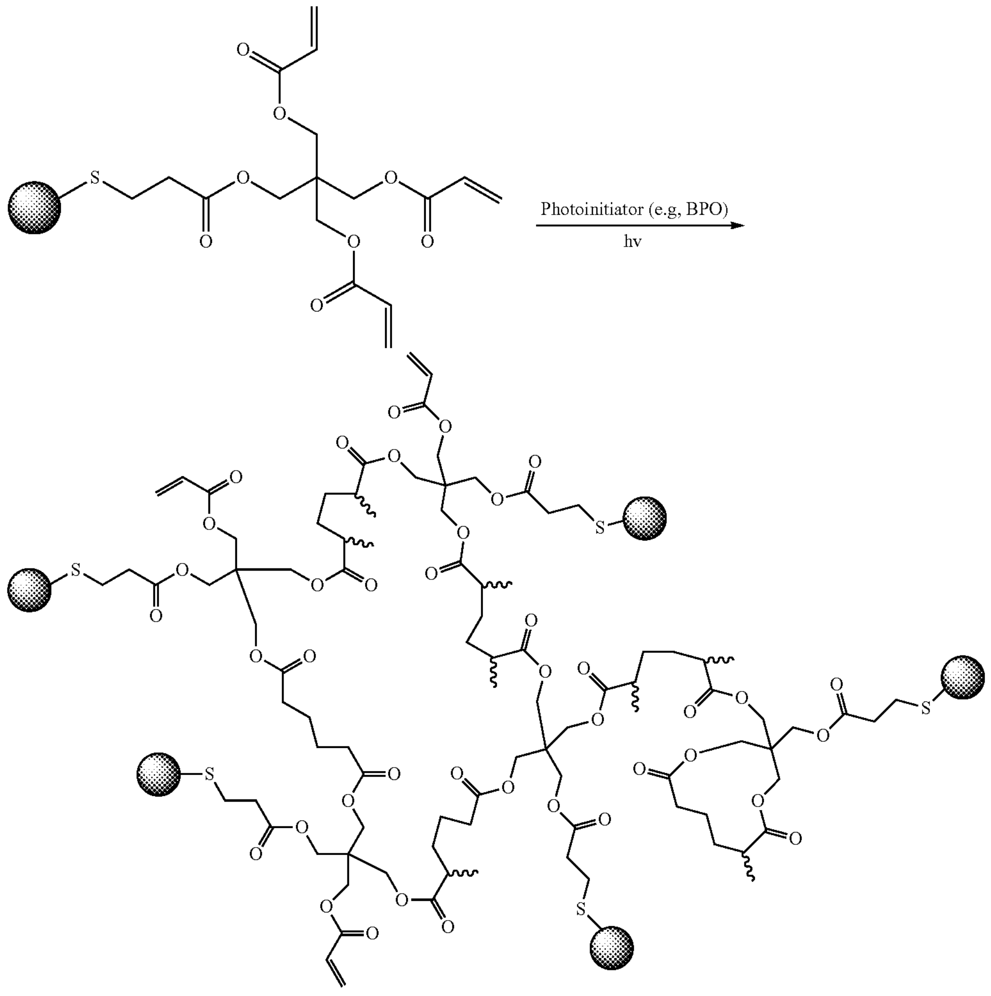

BPO (Dibenzoyl Peroxide, CAS 94-36-0)

The reactions of other quantum dot-ligand materials after exposure can refer to the above content.

Preparation Examples of a Display Panel

The display panel includes quantum dot light-emitting devices. The quantum dot light-emitting device includes sequentially stacked anode, hole injection layer, hole transport layer, quantum dot light-emitting layer, electron transport layer, electron injection layer, and cathode.

The method for preparing the display panel specifically includes the following steps.

The transparent substrate is cleaned using a standard method, and then a gate metal Mo of 200 nm, a gate dielectric $SiO_2$ of 150 nm, an active layer IGZO of 40 nm, a source and drain metal Mo of 200 nm, a passivation layer $SiO_2$ of 300 nm, and a pixel electrode ITO of 40 nm are deposited sequentially and patterned. Finally, the acrylic materials are spin coated and deposed, followed by photolithography and solidification, to form a pixel definition layer of about 1.5 μm, forming a TFT backplane.

Before preparing the quantum dot light-emitting device (QD-LED), a surface of the TFT backplane is treated with plasma.

The hole injection layer and the hole transport layer is prepared using spin coating process, such as spin coating PEDOT (poly 3,4-ethylenedioxythiophene), PSS (polystyrene sulfonic acid), and TFB, respectively, with an overall thickness of 50-100 nm.

The above photolithography process is used to form a quantum dot light-emitting layer, which specifically includes coating a first color quantum dot-ligand solution, applying a first Photo Mask, exposing in whole with ultraviolet light, and then developing and fixing to form the first color sub-pixel, coating a second color quantum dot-ligand solution, applying a second Photo Mask, exposing in whole with ultraviolet light, and then developing and fixing to form a second color sub-pixel, coating finally a third color quantum dot-ligand solution, applying a third Photo Mask, exposing in whole with ultraviolet light, and then developing and fixing to form a third color sub-pixel.

Spin coating or vapor deposition is used to form an electron transport layer and an electron injection layer, such as ZnO nanoparticles, etc.

A thin layer of cathode metal can be evaporated, and the cathode can be an Al layer, which is about 500-1000 nm. After the evaporation is completed, it is packaged and cut to complete the preparation of the entire display panel.

The AMQLED device can emit light from the bottom, with a minimum area of a sub-pixel that can be prepared is 10-30 microns, and a display panel of about 300-800 ppi.

It should be noted that although various steps of the methods of the present disclosure are depicted in a particular order in the drawings, this does not require or imply that the steps must be performed in that particular order, or that all illustrated steps must be performed in order to achieve the desired result. Additionally or alternatively, certain steps can be omitted, multiple steps can be combined into one step for execution, and/or one step can be decomposed into multiple steps for execution, etc., all of which should be considered as part of the present disclosure.

It should be understood that the present disclosure does not limit its application to the detailed structure and arrangement of components set forth in this specification. The present disclosure can have other embodiments and can be implemented and carried out in various ways. The above variations and modifications fall within the scope of the present disclosure. It will be understood that the disclosure disclosed and defined in this specification extends to all alternative combinations of two or more of the individual features mentioned or evident in the text and/or drawings. All of these different combinations constitute various alternative aspects of the present disclosure. The embodiments of this specification illustrate the best mode known for carrying out the disclosure, and will enable those skilled in the art to utilize the disclosure.

What is claimed is:

1. A quantum dot ligand, wherein a general formula of a structure of the quantum dot ligand is shown in formula 1, formula 1

X—Y—Z;

where X is a coordinating group configured to form a coordination bond with a quantum dot body;

Y is a linking group, wherein the linking group is selected from a flexible chain that does not comprise a rigid group; and Z comprises at least two cross-linkable groups, wherein the cross-linkable groups have linking ends, the linking ends of the at least two cross-linkable groups are linked to the same carbon atom, and tail ends of the cross-linkable groups comprise carbon-carbon double bonds;

wherein the cross-linkable groups further comprise ester structures linked between the linking ends and the carbon-carbon double bonds.

2. The quantum dot ligand according to claim 1, wherein the carbon-carbon double bonds of the cross-linkable groups can generate free radicals under the action of a photoinitiator and light; and among the at least two cross-linkable groups linked to the same carbon atom, a free radical generated by the carbon-carbon double bond of one of the cross-linkable groups can trigger the carbon-carbon double bond of a next one of the cross-linkable groups to generate a new free radical.

3. The quantum dot ligand according to claim 1, wherein Z has a structure as described in formula 2, formula 2

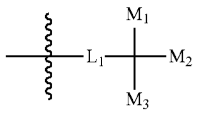

-continued formula 2-1

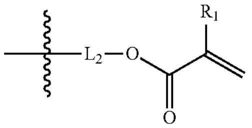

formula 2-2

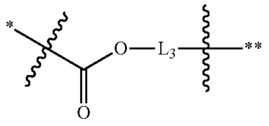

where

represents a chemical bond;

* represents a structure shown in formula 2-2 is for linking with Y, and * * represents the structure shown in formula 2-2 is configured for linking with

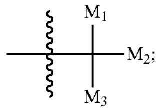

M1, M2, and M3 are independently selected from hydrogen, an alkyl group with 1-10 carbon atoms, a conjugated group, a polyethylene glycol segment, or a structure shown in formula 2-1, and at least two of M1, M2, and M3 are selected from the structure shown in formula 2-1;

$L_1$ is selected from the structure shown in formula 2-2;

$R_1$ is selected from hydrogen or alkyl groups with 1-6 carbon atoms; and $L_2$ and $L_3$ are independently selected from alkylene groups with 1-6 carbon atoms.

4. The quantum dot ligand according to claim 3, wherein the conjugated group is selected from an aniline structure, a triphenylamine like structure, or a carbazole like structure.

5. The quantum dot ligand according to claim 3, wherein M1, M2, and M3 are independently selected from the hydrogen, the alkyl group with 1-10 carbon atoms, the conjugated group, the polyethylene glycol segment, or a collection composed of following groups:

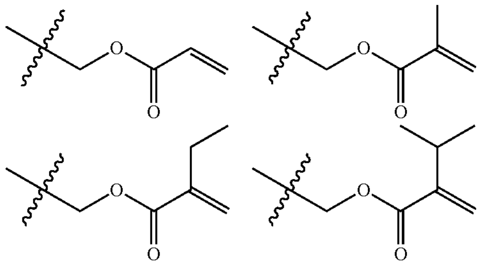

-continued

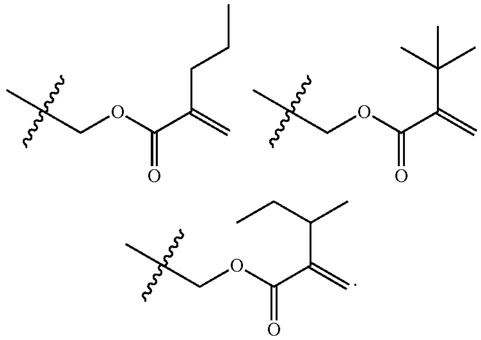

6. The quantum dot ligand according to claim 3, wherein $L_1$ is selected from following group:

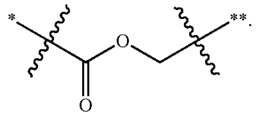

7. The quantum dot ligand according to claim 1, wherein Z is selected from a collection composed of following groups:

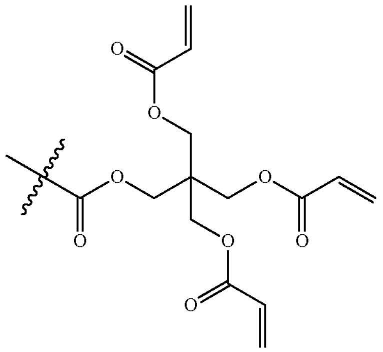

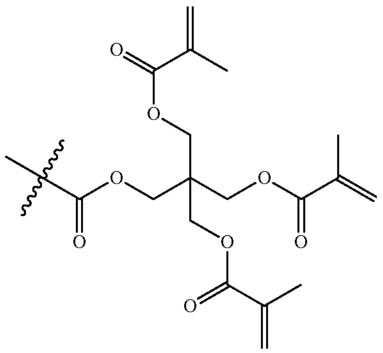

-continued

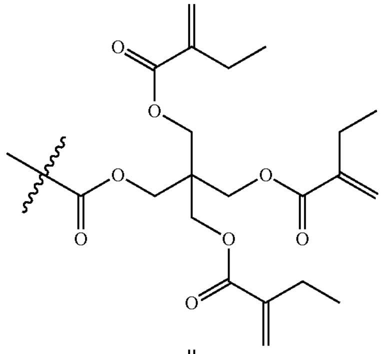

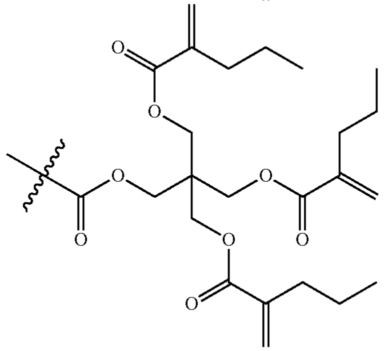

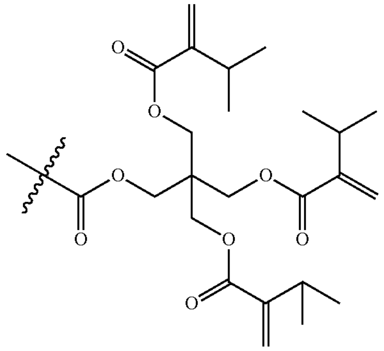

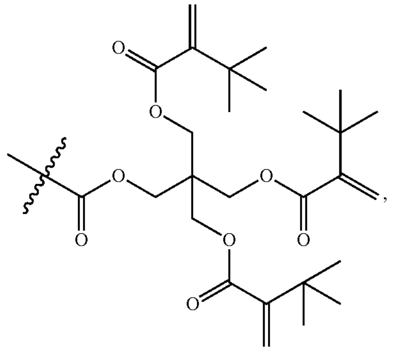

where

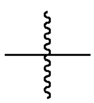

represents a chemical bond.

8. The quantum dot ligand according to claim 1, wherein the linking group is selected from a straight chain alkylidene with 2-8 carbon atoms.

9. The quantum dot ligand according to claim 1, wherein the quantum dot ligand is selected from a collection composed of following structures:

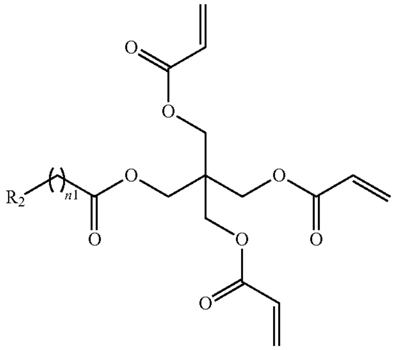

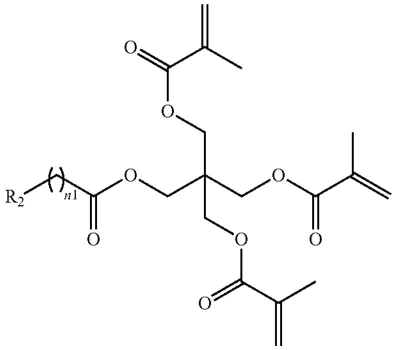

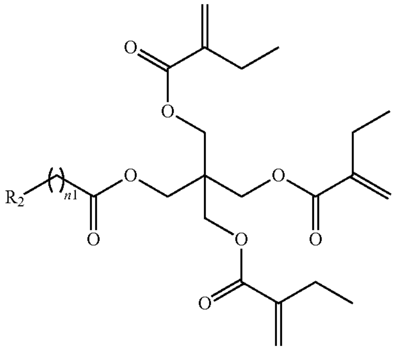

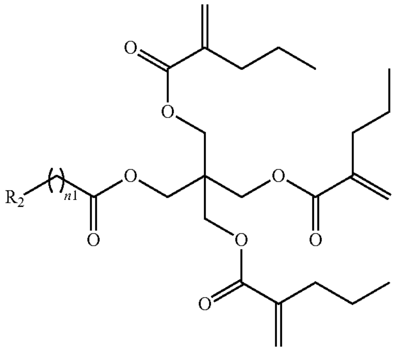

-continued

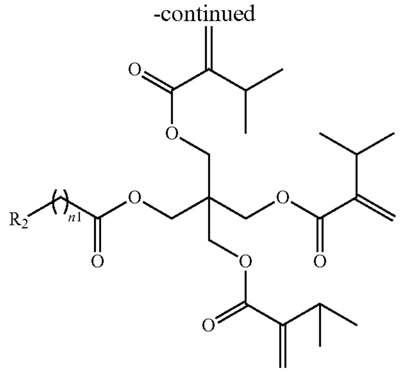

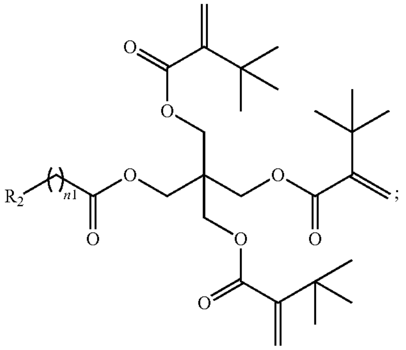

where $R_2$ is selected from amino, carboxylic acid, sulfhydryl, double sulfhydryl, phosphine or phosphine oxide; and n1 is selected from any integer in a range of 2-8.

10. A method for preparing a quantum dot light-emitting device, comprising:

providing a first color mixed solution, wherein the first color mixed solution comprises a photoinitiator and a first color quantum dot-ligand material, the first color quantum dot-ligand material comprises a first color quantum dot body and the quantum dot ligand according to claim 1, and a coordination bond is formed between the first color quantum dot ligand and the first color quantum dot body;

providing a second color mixed solution, wherein the second color mixed solution comprises a photoinitiator and a second color quantum dot-ligand material, the second color quantum dot-ligand material comprises a second color quantum dot body and the quantum dot ligand according to claim 1, and a coordination bond is formed between the second color quantum dot ligand and the second color quantum dot body;

coating a substrate with the first color mixed solution, for exposure and development, to form a first color sub-pixel; and coating the substrate with the second color mixed solution, for exposure and development, to form a second color sub-pixel.

11. A quantum dot-ligand material comprising a quantum dot body and a quantum dot ligand, wherein a general formula of a structure of the quantum dot ligand is shown in formula 1, $$X—Y—Z; \quad \text{formula 1}$$

where X is a coordinating group configured to form a coordination bond with a quantum dot body;

Y is a linking group, wherein the linking group is selected from a flexible chain that does not comprise a rigid group; and Z comprises at least two cross-linkable groups, wherein the cross-linkable groups have linking ends, the linking ends of the at least two cross-linkable groups are linked to the same carbon atom, and tail ends of the cross-linkable groups comprise carbon-carbon double bonds;

wherein the cross-linkable groups further comprise ester structures linked between the linking ends and the carbon-carbon double bonds; and wherein a coordination bond is formed between the quantum dot ligand and the quantum dot body.

12. The quantum dot-ligand material according to claim 11, wherein the quantum dot-ligand material is selected from a collection composed of following groups:

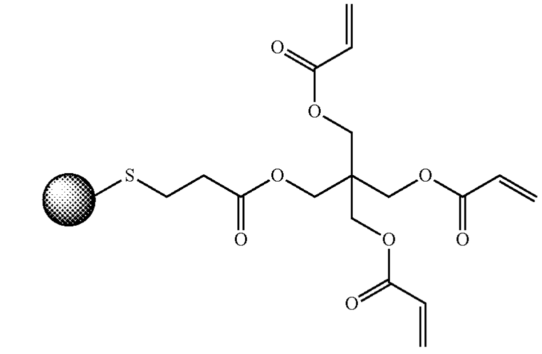

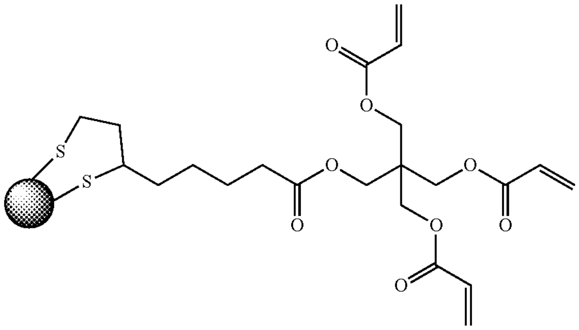

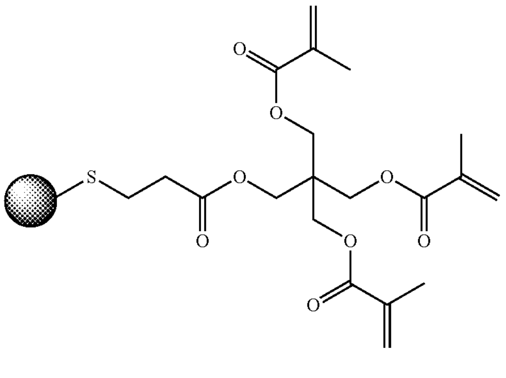

-continued

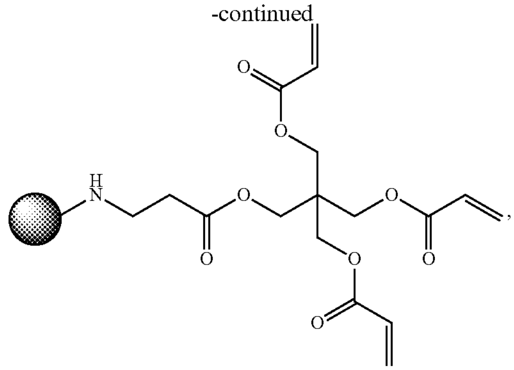

, where

represents the quantum dot body.

13. A method for preparing a quantum dot pattern, comprising:

providing a mixed solution of a photoinitiator and the quantum dot-ligand material according to claim 12;

coating the mixed solution on a substrate and performing an exposure treatment, so that the carbon-carbon double bonds in the cross-linkable groups are cross linked; and performing development processing to form the quantum dot pattern.

14. A quantum dot light-emitting layer, wherein a material of the quantum dot light-emitting layer comprises a first quantum dot body, a second quantum dot body, and a quantum dot ligand, wherein a general formula of a structure of the quantum dot ligand is shown in formula 1, formula 1

$$X—Y—Z;$$

where X is a coordinating group configured to form a coordination bond with a quantum dot body;

Y is a linking group, wherein the linking group is selected from a flexible chain that does not comprise a rigid group; and Z comprises at least two cross-linkable groups, wherein the cross-linkable groups have linking ends, the linking ends of the at least two cross-linkable groups are linked to the same carbon atom, and tail ends of the cross-linkable groups comprise carbon-carbon double bonds;

wherein the cross-linkable groups further comprise ester structures linked between the linking ends and the carbon-carbon double bonds;

the quantum dot ligand forms coordination bonds with the first quantum dot body and the second quantum dot body, respectively; and the first quantum dot body and the second quantum dot body are cross linked through the cross-linkable groups in the quantum dot ligand to form a network structure.

15. A quantum dot light-emitting device comprising the quantum dot light-emitting layer according to claim 14.

16. A display apparatus comprising the quantum dot light-emitting device according to claim 15.

17. The quantum dot light-emitting device according to claim 15, further comprising a substrate, a first electrode, a hole injection layer, a hole transport layer, an electron transport layer, an electron injection layer, and a second electrode, wherein the first electrode, the hole injection layer, the hole transport layer, the quantum dot light-emitting layer, the electron transport layer, the electron injection layer, and the second electrode are sequentially stacked on a side of the substrate.

18. The quantum dot light-emitting device according to claim 17, wherein at least one of the first electrode or the second electrode is connected to an auxiliary electrode.

19. The quantum dot light-emitting device according to claim 17, wherein quantum dots of different sizes in the quantum dot light-emitting layer emit light of different colors and form sub-pixels of different colors.

* * * * *